(12) United States Patent
Salo, III et al.

(10) Patent No.: US 11,474,153 B2
(45) Date of Patent: Oct. 18, 2022

(54) BATTERY PACK MAINTENANCE SYSTEM

(71) Applicant: Midtronics, Inc., Willowbrook, IL (US)

(72) Inventors: Andrew John Salo, III, Chicago, IL (US); Bryan Paul Roland, Tinley Park, IL (US)

(73) Assignee: MIDTRONICS, INC., Willowbrook, IL (US)

( * ) Notice: Subject to any disclaimer, the term of this patent is extended or adjusted under 35 U.S.C. 154(b) by 77 days.

(21) Appl. No.: 17/090,129

(22) Filed: Nov. 5, 2020

(65) Prior Publication Data
US 2021/0141021 A1 May 13, 2021

Related U.S. Application Data

(60) Provisional application No. 62/934,122, filed on Nov. 12, 2019.

(51) Int. Cl.
*G01R 31/00* (2006.01)
*G01R 31/36* (2020.01)
(Continued)

(52) U.S. Cl.
CPC ....... *G01R 31/3644* (2013.01); *G01R 31/371* (2019.01); *G01R 31/387* (2019.01); *G01R 31/389* (2019.01); *H01M 10/425* (2013.01); *H01M 10/4285* (2013.01); *H01M 10/48* (2013.01); *H01M 2010/4271* (2013.01)

(58) Field of Classification Search
USPC .................. 324/426, 432–435; 320/106, 132
See application file for complete search history.

(56) References Cited

U.S. PATENT DOCUMENTS

| 85,553 A | 1/1869 | Adams ........................... 33/472 |
| 2,000,665 A | 5/1935 | Neal ............................ 439/440 |

(Continued)

FOREIGN PATENT DOCUMENTS

| CN | 2470964 Y | 1/2002 |
| CN | 201063352 Y | 5/2008 |

(Continued)

OTHER PUBLICATIONS

"Electrochemical Impedance Spectroscopy in Battery Development and Testing", *Batteries International*, Apr. 1997, pp. 59 and 62-63.
(Continued)

*Primary Examiner* — Vincent Q Nguyen
(74) *Attorney, Agent, or Firm* — Westman, Champlin & Koehler, P.A.

(57) ABSTRACT

A battery pack maintenance system includes maintenance circuitry, image input circuitry, a display, and user input circuitry. The maintenance circuitry is configured to perform a maintenance operation on a battery pack having a plurality of batteries. The image input circuitry is configured to receive an image of the battery pack. The display is configured to display the image. The user input circuitry is configured to receive a battery selection user input identifying a selected battery of the battery pack. The maintenance circuitry is configured to associate the battery selection user input with a maintenance operation performed on the selected battery.

34 Claims, 10 Drawing Sheets

(51) Int. Cl.
*G01R 31/387* (2019.01)
*G01R 31/389* (2019.01)
*H01M 10/48* (2006.01)
*H01M 10/42* (2006.01)
*G01R 31/371* (2019.01)

(56) References Cited

U.S. PATENT DOCUMENTS

| | | | |
|---|---|---|---|
| 2,254,846 A | 9/1941 | Heyer | 324/437 |
| 2,417,940 A | 3/1947 | Lehman | 200/61.25 |
| 2,437,772 A | 3/1948 | Wall | 324/523 |
| 2,514,745 A | 7/1950 | Dalzell | 324/115 |
| 2,727,221 A | 12/1955 | Springg | 340/447 |
| 3,025,455 A | 3/1962 | Jonsson | 323/369 |
| 3,178,686 A | 4/1965 | Mills | 340/447 |
| 3,215,194 A | 11/1965 | Sununu et al. | 165/80.3 |
| 3,223,969 A | 12/1965 | Alexander | 340/447 |
| 3,267,452 A | 8/1966 | Wolf | 340/249 |
| 3,356,936 A | 12/1967 | Smith | 324/429 |
| 3,562,634 A | 2/1971 | Latner | 324/427 |
| 3,593,099 A | 7/1971 | Scholl | 320/127 |
| 3,607,673 A | 9/1971 | Seyl | 324/425 |
| 3,652,341 A | 3/1972 | Halsall et al. | 29/623.2 |
| 3,676,770 A | 7/1972 | Sharaf et al. | 324/430 |
| 3,699,433 A | 10/1972 | Smith, Jr. | 324/523 |
| 3,704,439 A | 11/1972 | Nelson | |
| 3,729,989 A | 5/1973 | Little | 73/862.192 |
| 3,745,441 A | 7/1973 | Soffer | 290/14 |
| 3,750,011 A | 7/1973 | Kreps | 324/430 |
| 3,753,094 A | 8/1973 | Furuishi et al. | 324/430 |
| 3,776,177 A | 12/1973 | Bryant et al. | 116/311 |
| 3,796,124 A | 3/1974 | Crosa | 411/521 |
| 2,689,939 A | 4/1974 | Godshalk | |
| 3,808,401 A | 4/1974 | Wright et al. | |
| 3,808,522 A | 4/1974 | Sharaf | 324/430 |
| 3,808,573 A | 4/1974 | Cappell | |
| 3,811,089 A | 5/1974 | Strezelewicz | 324/170 |
| 3,816,805 A | 6/1974 | Terry | 320/123 |
| 3,850,490 A | 11/1974 | Zehr | 439/822 |
| 3,857,082 A | 12/1974 | Van Opijnen | 320/143 |
| 3,873,911 A | 3/1975 | Champlin | 324/430 |
| 3,876,931 A | 4/1975 | Godshalk | 324/429 |
| 3,879,654 A | 4/1975 | Kessinger | 324/434 |
| 3,886,426 A | 5/1975 | Daggett | 320/117 |
| 3,886,443 A | 5/1975 | Miyakawa et al. | 324/426 |
| 3,889,248 A | 6/1975 | Ritter | 340/636.11 |
| 3,906,329 A | 9/1975 | Bader | 320/134 |
| 3,909,708 A | 9/1975 | Champlin | 324/431 |
| 3,920,284 A | 11/1975 | Lane et al. | 303/122.06 |
| 3,936,744 A | 2/1976 | Perlmutter | 324/772 |
| 3,939,400 A | 2/1976 | Steele | 324/434 |
| 3,946,299 A | 3/1976 | Christianson et al. | 320/430 |
| 3,947,757 A | 3/1976 | Grube et al. | 324/416 |
| 3,969,667 A | 7/1976 | McWilliams | 324/427 |
| 3,979,664 A | 9/1976 | Harris | 324/397 |
| 3,984,762 A | 10/1976 | Dowgiallo, Jr. | 324/430 |
| 3,984,768 A | 10/1976 | Staples | 324/712 |
| 3,989,544 A | 11/1976 | Santo | 429/65 |
| 3,997,830 A | 12/1976 | Newell et al. | 320/102 |
| 4,008,619 A | 2/1977 | Alcaide et al. | 73/724 |
| 4,023,882 A | 5/1977 | Pettersson | 439/426 |
| 4,024,953 A | 5/1977 | Nailor, III | 206/344 |
| 4,047,091 A | 9/1977 | Hutchines et al. | 363/59 |
| 4,053,824 A | 10/1977 | Dupuis et al. | 324/434 |
| 4,056,764 A | 11/1977 | Endo et al. | 320/101 |
| 4,057,313 A | 11/1977 | Polizzano | 439/219 |
| 4,070,624 A | 1/1978 | Taylor | 324/772 |
| 4,086,531 A | 4/1978 | Bernier | 324/772 |
| 4,106,025 A | 8/1978 | Katz | 343/715 |
| 4,112,351 A | 9/1978 | Back et al. | 324/380 |
| 4,114,083 A | 9/1978 | Benham et al. | 340/636.13 |
| 4,126,874 A | 11/1978 | Suzuki et al. | 396/301 |
| 4,160,916 A | 7/1979 | Papasideris | 307/10.6 |
| 4,176,315 A | 11/1979 | Sunnarborg | 324/133 |
| 4,178,546 A | 12/1979 | Hulls et al. | 324/772 |
| 4,193,025 A | 3/1980 | Frailing et al. | 324/427 |
| 4,207,610 A | 6/1980 | Gordon | 701/33.9 |
| 4,207,611 A | 6/1980 | Gordon | 701/33 |
| 4,217,645 A | 8/1980 | Barry et al. | 702/63 |
| 4,218,745 A | 8/1980 | Perkins | 324/66 |
| 4,280,457 A | 7/1981 | Bloxham | 123/198 R |
| 4,295,468 A | 10/1981 | Bartelt | |
| 4,297,639 A | 10/1981 | Branham | 324/429 |
| 4,307,342 A | 12/1981 | Peterson | 324/767 |
| 4,315,204 A | 2/1982 | Sievers et al. | 322/28 |
| 4,316,185 A | 2/1982 | Watrous et al. | 340/636.11 |
| 4,322,685 A | 3/1982 | Frailing et al. | 324/429 |
| 4,351,405 A | 6/1982 | Fields et al. | 180/65.2 |
| 4,352,067 A | 9/1982 | Ottone | 324/434 |
| 4,360,780 A | 11/1982 | Skutch, Jr. | 324/437 |
| 4,361,809 A | 11/1982 | Bil et al. | 324/426 |
| 4,363,407 A | 12/1982 | Buckler et al. | 209/3.3 |
| 4,369,407 A | 1/1983 | Korbell | 324/416 |
| 4,379,989 A | 4/1983 | Kurz et al. | 320/165 |
| 4,379,990 A | 4/1983 | Sievers et al. | 322/99 |
| 4,385,269 A | 5/1983 | Aspinwall et al. | 320/129 |
| 4,390,828 A | 6/1983 | Converse et al. | 320/153 |
| 4,392,101 A | 7/1983 | Saar et al. | 320/156 |
| 4,396,880 A | 8/1983 | Windebank | 320/156 |
| 4,408,157 A | 10/1983 | Beaubien | 324/712 |
| 4,412,169 A | 10/1983 | Dell'Orto | 320/123 |
| 4,423,378 A | 12/1983 | Marino et al. | 324/427 |
| 4,423,379 A | 12/1983 | Jacobs et al. | 324/429 |
| 4,424,491 A | 1/1984 | Bobbett et al. | 324/433 |
| 4,425,791 A | 1/1984 | Kling | 73/116.02 |
| 4,441,359 A | 4/1984 | Ezoe | 73/116.06 |
| 4,459,548 A | 7/1984 | Lentz et al. | 324/472 |
| 4,502,000 A | 2/1985 | Mashikian | |
| 4,514,694 A | 4/1985 | Finger | 324/429 |
| 4,520,353 A | 5/1985 | McAuliffe | 340/636.16 |
| 4,521,498 A | 6/1985 | Juergens | 429/59 |
| 4,544,312 A | 10/1985 | Stencel | |
| 4,560,230 A | 12/1985 | Inglis | 439/890 |
| 4,564,798 A | 1/1986 | Young | 320/103 |
| 4,620,767 A | 11/1986 | Woolf | 439/217 |
| 4,626,765 A | 12/1986 | Tanaka | 320/127 |
| 4,633,418 A | 12/1986 | Bishop | 702/63 |
| 4,637,359 A | 1/1987 | Cook | 123/179 |
| 4,643,511 A | 2/1987 | Gawlik | 439/755 |
| 4,659,977 A | 4/1987 | Kissel et al. | 320/150 |
| 4,663,580 A | 5/1987 | Wortman | 320/153 |
| 4,665,370 A | 5/1987 | Holland | 324/429 |
| 4,667,143 A | 5/1987 | Cooper et al. | 320/153 |
| 4,667,279 A | 5/1987 | Maier | 363/46 |
| 4,678,998 A | 7/1987 | Muramatsu | 324/427 |
| 4,679,000 A | 7/1987 | Clark | 324/428 |
| 4,680,528 A | 7/1987 | Mikami et al. | 320/165 |
| 4,686,442 A | 8/1987 | Radomski | 320/123 |
| 4,697,134 A | 9/1987 | Burkum et al. | 320/134 |
| 4,707,795 A | 11/1987 | Alber et al. | 702/63 |
| 4,709,202 A | 11/1987 | Koenck et al. | 320/112 |
| 4,710,861 A | 12/1987 | Kanner | 363/46 |
| 4,719,428 A | 1/1988 | Liebermann | 324/436 |
| 4,723,656 A | 2/1988 | Kiernan et al. | 206/705 |
| 4,743,855 A | 5/1988 | Randin et al. | 324/430 |
| 4,745,349 A | 5/1988 | Palanisamy et al. | 320/125 |
| 4,773,011 A | 9/1988 | VanHoose | 701/30 |
| 4,781,629 A | 11/1988 | Mize | 439/822 |
| D299,909 S | 2/1989 | Casey | D10/77 |
| 4,816,768 A | 3/1989 | Champlin | 324/428 |
| 4,820,966 A | 4/1989 | Fridman | 320/116 |
| 4,825,170 A | 4/1989 | Champlin | 324/436 |
| 4,826,457 A | 5/1989 | Varatta | 439/504 |
| 4,847,547 A | 7/1989 | Eng, Jr. et al. | 320/153 |
| 4,849,700 A | 7/1989 | Morioka et al. | 324/427 |
| 4,874,679 A | 10/1989 | Miyagawa | 429/91 |
| 4,876,495 A | 10/1989 | Palanisamy et al. | 320/106 |
| 4,881,038 A | 11/1989 | Champlin | 324/426 |
| 4,885,523 A | 12/1989 | Koench | 230/131 |
| 4,888,716 A | 12/1989 | Ueno | 702/63 |
| 4,901,007 A | 2/1990 | Sworm | 324/110 |
| 4,907,176 A | 3/1990 | Bahnick et al. | 364/551.01 |
| 4,912,416 A | 3/1990 | Champlin | 324/430 |
| 4,913,116 A | 4/1990 | Katogi et al. | 123/406.32 |

(56) References Cited

U.S. PATENT DOCUMENTS

| | | | |
|---|---|---|---|
| 4,926,330 A | 5/1990 | Abe et al. | 701/33 |
| 4,929,931 A | 5/1990 | McCuen | 340/636.15 |
| 4,931,738 A | 6/1990 | MacIntyre et al. | 324/435 |
| 4,932,905 A | 6/1990 | Richards | 439/822 |
| 4,933,845 A | 6/1990 | Hayes | 710/104 |
| 4,934,957 A | 6/1990 | Bellusci | 439/504 |
| 4,937,528 A | 6/1990 | Palanisamy | 324/430 |
| 4,947,124 A | 8/1990 | Hauser | 324/430 |
| 4,949,046 A | 8/1990 | Seyfang | 324/427 |
| 4,956,597 A | 9/1990 | Heavey et al. | 320/129 |
| 4,965,738 A | 10/1990 | Bauer et al. | 320/136 |
| 4,968,941 A | 11/1990 | Rogers | 324/428 |
| 4,968,942 A | 11/1990 | Palanisamy | 324/430 |
| 4,969,834 A | 11/1990 | Johnson | 439/141 |
| 4,983,086 A | 1/1991 | Hatrock | 411/259 |
| 5,004,979 A | 4/1991 | Marino et al. | 324/160 |
| 5,030,916 A | 7/1991 | Bokitch | 324/503 |
| 5,032,825 A | 7/1991 | Kuznicki | 340/636.15 |
| 5,034,893 A | 7/1991 | Fisher | 701/99 |
| 5,037,335 A | 8/1991 | Campbell | 439/217 |
| 5,037,778 A | 8/1991 | Stark et al. | 228/121 |
| 5,047,722 A | 9/1991 | Wurst et al. | 324/430 |
| 5,081,565 A | 1/1992 | Nabha et al. | 362/465 |
| 5,083,076 A | 1/1992 | Scott | 320/105 |
| 5,087,881 A | 2/1992 | Peacock | 324/378 |
| 5,095,223 A | 3/1992 | Thomas | 307/110 |
| 5,108,320 A | 4/1992 | Kimber | 439/883 |
| 5,109,213 A | 4/1992 | Williams | 340/447 |
| 5,126,675 A | 6/1992 | Yang | 324/435 |
| 5,130,658 A | 7/1992 | Bohmer | 324/435 |
| 5,140,269 A | 8/1992 | Champlin | 324/433 |
| 5,144,218 A | 9/1992 | Bosscha | 320/139 |
| 5,144,248 A | 9/1992 | Alexandres et al. | 324/428 |
| D330,338 S | 10/1992 | Wang | D10/77 |
| 5,159,272 A | 10/1992 | Rao et al. | 324/429 |
| 5,160,881 A | 11/1992 | Schramm et al. | 322/7 |
| 5,164,653 A | 11/1992 | Reem | |
| 5,167,529 A | 12/1992 | Verge | 427/1 |
| 5,168,208 A | 12/1992 | Schultz et al. | 322/25 |
| 5,170,124 A | 12/1992 | Blair et al. | 324/434 |
| 5,179,335 A | 1/1993 | Nor | 320/159 |
| 5,187,382 A | 2/1993 | Kondo | 307/10.1 |
| 5,194,799 A | 3/1993 | Tomantschger | 320/103 |
| 5,202,617 A | 4/1993 | Nor | |
| 5,204,611 A | 4/1993 | Nor et al. | 320/145 |
| 5,214,370 A | 5/1993 | Harm et al. | 320/152 |
| 5,214,385 A | 5/1993 | Gabriel et al. | 324/434 |
| 5,223,747 A | 6/1993 | Tschulena | 257/713 |
| 5,241,275 A | 8/1993 | Fang | 324/430 |
| 5,254,952 A | 10/1993 | Salley et al. | 324/429 |
| 5,266,880 A | 11/1993 | Newland | 320/125 |
| 5,278,759 A | 1/1994 | Berra et al. | 701/1 |
| 5,281,919 A | 1/1994 | Palanisamy | 324/427 |
| 5,281,920 A | 1/1994 | Wurst | 324/430 |
| 5,295,078 A | 3/1994 | Stich et al. | 700/297 |
| 5,296,823 A | 3/1994 | Dietrich | 333/161 |
| 5,298,797 A | 3/1994 | Redl | 327/387 |
| 5,300,874 A | 4/1994 | Shimamoto et al. | 320/106 |
| 5,302,902 A | 4/1994 | Groehl | 324/434 |
| 5,309,052 A | 5/1994 | Kim | 74/350 |
| 5,313,152 A | 5/1994 | Wozniak et al. | 320/118 |
| 5,315,287 A | 5/1994 | Sol | 340/455 |
| 5,321,231 A | 6/1994 | Schmalzriedt et al. | |
| 5,321,626 A | 6/1994 | Palladino | 702/63 |
| 5,321,627 A | 6/1994 | Reher | 702/63 |
| 5,323,337 A | 6/1994 | Wilson et al. | 702/73 |
| 5,325,041 A | 6/1994 | Briggs | 320/149 |
| 5,331,268 A | 7/1994 | Patino et al. | 320/156 |
| 5,332,927 A | 7/1994 | Paul et al. | 307/66 |
| 5,336,993 A | 8/1994 | Thomas et al. | 324/158.1 |
| 5,338,515 A | 8/1994 | Dalla Betta et al. | 422/95 |
| 5,339,018 A | 8/1994 | Brokaw | 320/147 |
| 5,343,380 A | 8/1994 | Champlin | 363/46 |
| 5,345,384 A | 9/1994 | Przybyla et al. | 701/29.1 |
| 5,347,163 A | 9/1994 | Yoshimura | 307/66 |
| 5,349,535 A | 9/1994 | Gupta | 320/106 |
| 5,352,968 A | 10/1994 | Reni et al. | 320/136 |
| 5,357,519 A | 10/1994 | Martin et al. | 371/15.1 |
| 5,365,160 A | 11/1994 | Leppo et al. | 320/160 |
| 5,365,453 A | 11/1994 | Startup et al. | 702/36 |
| 5,369,364 A | 11/1994 | Renirie et al. | 324/430 |
| 5,381,096 A | 1/1995 | Hirzel | 324/427 |
| 5,384,540 A | 1/1995 | Dessel | 324/539 |
| 5,387,871 A | 2/1995 | Tsai | 324/429 |
| 5,394,093 A | 2/1995 | Cervas | 324/556 |
| 5,402,007 A | 3/1995 | Center et al. | 290/40 B |
| 5,410,754 A | 4/1995 | Klotzbach et al. | 370/466 |
| 5,412,308 A | 5/1995 | Brown | 323/267 |
| 5,412,323 A | 5/1995 | Kato et al. | 324/429 |
| 5,425,041 A | 6/1995 | Seko et al. | 372/45.01 |
| 5,426,371 A | 6/1995 | Salley et al. | 324/429 |
| 5,426,416 A | 6/1995 | Jefferies et al. | 340/664 |
| 5,430,645 A | 7/1995 | Keller | 364/424.01 |
| 5,432,025 A | 7/1995 | Cox | 29/65 |
| 5,432,426 A | 7/1995 | Yoshida | 320/160 |
| 5,432,429 A | 7/1995 | Armstrong, II et al. | |
| 5,434,495 A | 7/1995 | Toko | 320/135 |
| 5,435,185 A | 7/1995 | Eagan | 73/587 |
| 5,442,274 A | 8/1995 | Tamai | 320/146 |
| 5,445,026 A | 8/1995 | Eagan | 73/591 |
| 5,449,996 A | 9/1995 | Matsumoto et al. | 320/148 |
| 5,449,997 A | 9/1995 | Gilmore et al. | 320/148 |
| 5,451,881 A | 9/1995 | Finger | 324/433 |
| 5,453,027 A | 9/1995 | Buell et al. | 439/433 |
| 5,457,377 A | 10/1995 | Jonsson | 324/430 |
| 5,459,660 A | 10/1995 | Berra | 701/33 |
| 5,462,439 A | 10/1995 | Keith | 180/279 |
| 5,469,043 A | 11/1995 | Cherng et al. | 320/161 |
| 5,485,090 A | 1/1996 | Stephens | 324/433 |
| 5,486,123 A | 1/1996 | Miyazaki | 439/825 |
| 5,488,300 A | 1/1996 | Jamieson | 324/432 |
| 5,504,674 A | 4/1996 | Chen et al. | 705/4 |
| 5,508,599 A | 4/1996 | Koenck | 320/138 |
| 5,519,383 A | 5/1996 | De La Rosa | 340/636.15 |
| 5,528,148 A | 6/1996 | Rogers | 320/137 |
| 5,537,967 A | 7/1996 | Tashiro et al. | 123/192.1 |
| 5,541,489 A | 7/1996 | Dunstan | 320/134 |
| 5,546,317 A | 8/1996 | Andrieu | 702/63 |
| 5,548,273 A | 8/1996 | Nicol et al. | 340/439 |
| 5,550,485 A | 8/1996 | Falk | 324/772 |
| 5,555,498 A | 9/1996 | Berra | |
| 5,561,380 A | 10/1996 | Sway-Tin et al. | 324/509 |
| 5,562,501 A | 10/1996 | Kinoshita et al. | 439/852 |
| 5,563,496 A | 10/1996 | McClure | 320/128 |
| 5,572,136 A | 11/1996 | Champlin | 324/426 |
| 5,573,611 A | 11/1996 | Koch et al. | 152/152.1 |
| 5,574,355 A | 11/1996 | McShane et al. | 320/161 |
| 5,578,915 A | 11/1996 | Crouch, Jr. et al. | 324/428 |
| 5,583,416 A | 12/1996 | Klang | 320/160 |
| 5,585,416 A | 12/1996 | Audett et al. | 522/35 |
| 5,585,728 A | 12/1996 | Champlin | 324/427 |
| 5,589,292 A | 12/1996 | Rozon | |
| 5,589,757 A | 12/1996 | Klang | 320/160 |
| 5,592,093 A | 1/1997 | Klingbiel | 324/426 |
| 5,592,094 A | 1/1997 | Ichikawa | 324/427 |
| 5,596,260 A | 1/1997 | Moravec et al. | 320/135 |
| 5,596,261 A | 1/1997 | Suyama | 320/152 |
| 5,598,098 A | 1/1997 | Champlin | 324/430 |
| 5,602,462 A | 2/1997 | Stich et al. | 323/258 |
| 5,606,242 A | 2/1997 | Hull et al. | 320/106 |
| 5,614,788 A | 3/1997 | Mullins et al. | 315/82 |
| 5,621,298 A | 4/1997 | Harvey | 320/134 |
| 5,631,536 A | 5/1997 | Tseng | 320/15 |
| 5,631,831 A | 5/1997 | Bird et al. | 701/34.4 |
| 5,633,985 A | 5/1997 | Severson et al. | 704/267 |
| 5,637,978 A | 6/1997 | Kellett et al. | 320/104 |
| 5,642,031 A | 6/1997 | Brotto | 320/156 |
| 5,644,212 A | 7/1997 | Takahashi | 320/134 |
| 5,650,937 A | 7/1997 | Bounaga | 702/65 |
| 5,652,501 A | 7/1997 | McClure et al. | 340/636.15 |
| 5,653,659 A | 8/1997 | Kunibe et al. | 477/111 |
| 5,654,623 A | 8/1997 | Shiga et al. | 320/106 |
| 5,656,920 A | 8/1997 | Cherng et al. | 324/431 |
| 5,661,368 A | 8/1997 | Deol et al. | 315/82 |

(56) References Cited

U.S. PATENT DOCUMENTS

| | | | |
|---|---|---|---|
| 5,666,040 A | 9/1997 | Bourbeau | 320/118 |
| 5,675,234 A | 10/1997 | Greene | 340/636.11 |
| 5,677,077 A | 10/1997 | Faulk | 429/90 |
| 5,684,678 A | 11/1997 | Barrett | 363/17 |
| 5,685,734 A | 11/1997 | Kutz | 439/371 |
| 5,691,621 A | 11/1997 | Phuoc et al. | 320/134 |
| 5,699,050 A | 12/1997 | Kanazawa | 340/636.13 |
| 5,701,089 A | 12/1997 | Perkins | 324/772 |
| 5,705,929 A | 1/1998 | Caravello et al. | 324/430 |
| 5,707,015 A | 1/1998 | Guthrie | 241/120 |
| 5,710,503 A | 1/1998 | Sideris et al. | 320/116 |
| 5,711,648 A | 1/1998 | Hammerslag | 414/800 |
| 5,712,795 A | 1/1998 | Layman et al. | 700/297 |
| 5,717,336 A | 2/1998 | Basell et al. | 324/430 |
| 5,717,937 A | 2/1998 | Fritz | 713/300 |
| 5,721,688 A | 2/1998 | Bramwell | 324/426 |
| 5,732,074 A | 3/1998 | Spaur et al. | 370/313 |
| 5,739,667 A | 4/1998 | Matsuda et al. | 320/128 |
| 5,744,962 A | 4/1998 | Alber et al. | 324/426 |
| 5,745,044 A | 4/1998 | Hyatt, Jr. et al. | 340/5.23 |
| 5,747,189 A | 5/1998 | Perkins | 429/91 |
| 5,747,909 A | 5/1998 | Syverson et al. | 310/156.56 |
| 5,747,967 A | 5/1998 | Muljadi et al. | 320/148 |
| 5,754,417 A | 5/1998 | Nicollini | 363/60 |
| 5,757,192 A | 5/1998 | McShane et al. | 324/427 |
| 5,760,587 A | 6/1998 | Harvey | 324/434 |
| 5,772,468 A | 6/1998 | Kowalski et al. | 439/506 |
| 5,773,962 A | 6/1998 | Nor | 320/134 |
| 5,773,978 A | 6/1998 | Becker | 324/430 |
| 5,778,326 A | 7/1998 | Moroto et al. | 701/22 |
| 5,780,974 A | 7/1998 | Pabla et al. | 315/82 |
| 5,780,980 A | 7/1998 | Naito | 318/139 |
| 5,789,899 A | 8/1998 | van Phuoc et al. | 320/112 |
| 5,793,359 A | 8/1998 | Ushikubo | 345/169 |
| 5,796,239 A | 8/1998 | van Phuoc et al. | 320/107 |
| 5,808,469 A | 9/1998 | Kopera | 324/434 |
| 5,811,979 A | 9/1998 | Rhein | 324/718 |
| 5,818,201 A | 10/1998 | Stockstad et al. | 320/119 |
| 5,818,234 A | 10/1998 | McKinnon | 324/433 |
| 5,820,407 A | 10/1998 | Morse et al. | 439/504 |
| 5,821,756 A | 10/1998 | McShane et al. | 324/430 |
| 5,821,757 A | 10/1998 | Alvarez et al. | 324/434 |
| 5,825,174 A | 10/1998 | Parker | 324/106 |
| 5,826,467 A | 10/1998 | Huang | |
| 5,831,435 A | 11/1998 | Troy | 324/426 |
| 5,832,396 A | 11/1998 | Moroto et al. | 701/22 |
| 5,850,113 A | 12/1998 | Weimer et al. | 307/125 |
| 5,862,515 A | 1/1999 | Kobayashi et al. | 702/63 |
| 5,865,638 A | 2/1999 | Trafton | 439/288 |
| 5,869,951 A | 2/1999 | Takahashi | 320/104 |
| 5,870,018 A | 2/1999 | Person | 307/10.2 |
| 5,871,858 A | 2/1999 | Thomsen et al. | 429/7 |
| 5,872,443 A | 2/1999 | Williamson | 320/160 |
| 5,872,453 A | 2/1999 | Shimoyama et al. | 324/431 |
| 5,883,306 A | 3/1999 | Hwang | 73/146.8 |
| 5,884,202 A | 3/1999 | Arjomand | 701/31.4 |
| 5,895,440 A | 4/1999 | Proctor et al. | 702/63 |
| 5,903,154 A | 5/1999 | Zhang et al. | 324/437 |
| 5,903,716 A | 5/1999 | Kimber et al. | 395/114 |
| 5,912,534 A | 6/1999 | Benedict | 315/82 |
| 5,914,605 A | 6/1999 | Bertness | 324/430 |
| 5,916,287 A | 6/1999 | Arjomand et al. | 701/33.2 |
| 5,927,938 A | 7/1999 | Hammerslag | 414/809 |
| 5,929,609 A | 7/1999 | Joy et al. | 322/25 |
| 5,935,180 A | 8/1999 | Fieramosca et al. | 701/29.6 |
| 5,939,855 A | 8/1999 | Proctor et al. | 320/104 |
| 5,939,861 A | 8/1999 | Joko et al. | 320/122 |
| 5,945,829 A | 8/1999 | Bertness | 324/430 |
| 5,946,605 A | 8/1999 | Takahisa et al. | 455/68 |
| 5,950,144 A | 9/1999 | Hall et al. | 702/108 |
| 5,951,229 A | 9/1999 | Hammerslag | 414/398 |
| 5,953,322 A | 9/1999 | Kimball | 370/328 |
| 5,955,951 A | 9/1999 | Wischerop et al. | 340/572.8 |
| 5,961,561 A | 10/1999 | Wakefield, II | 701/29 |
| 5,961,604 A | 10/1999 | Anderson et al. | 709/229 |
| 5,963,012 A | 10/1999 | Garcia et al. | 320/106 |
| 5,969,625 A | 10/1999 | Russo | 340/636.19 |
| 5,973,598 A | 10/1999 | Beigel | 340/572.1 |
| 5,978,805 A | 11/1999 | Carson | 707/10 |
| 5,982,138 A | 11/1999 | Krieger | 320/105 |
| 5,990,664 A | 11/1999 | Rahman | 320/136 |
| 6,002,238 A | 12/1999 | Champlin | 320/134 |
| 6,005,489 A | 12/1999 | Siegle et al. | 340/825.69 |
| 6,005,759 A | 12/1999 | Hart et al. | 361/66 |
| 6,008,652 A | 12/1999 | Theofanopoulos et al. | 324/434 |
| 6,009,369 A | 12/1999 | Boisvert et al. | 701/99 |
| 6,009,742 A | 1/2000 | Balko | |
| 6,016,047 A | 1/2000 | Notten et al. | 320/137 |
| 6,031,354 A | 2/2000 | Wiley et al. | 320/116 |
| 6,031,368 A | 2/2000 | Klippel et al. | 324/133 |
| 6,037,745 A | 3/2000 | Koike et al. | 320/104 |
| 6,037,751 A | 3/2000 | Klang | 320/160 |
| 6,037,777 A | 3/2000 | Champlin | 324/430 |
| 6,037,778 A | 3/2000 | Makhija | 324/433 |
| 6,037,749 A | 4/2000 | Parsonage | 320/132 |
| 6,046,514 A | 4/2000 | Rouillard et al. | 307/77 |
| 6,051,976 A | 4/2000 | Bertness | 324/426 |
| 6,055,468 A | 4/2000 | Kaman et al. | 701/29 |
| 6,061,638 A | 5/2000 | Joyce | 702/63 |
| 6,064,372 A | 5/2000 | Kahkoska | 345/173 |
| 6,072,299 A | 6/2000 | Kurle et al. | 320/112 |
| 6,072,300 A | 6/2000 | Tsuji | 320/116 |
| 6,075,339 A | 6/2000 | Reipur et al. | 320/110 |
| 6,081,098 A | 6/2000 | Bertness et al. | 320/134 |
| 6,081,109 A | 6/2000 | Seymour et al. | 324/127 |
| 6,081,154 A | 6/2000 | Ezell et al. | 327/540 |
| 6,087,815 A | 7/2000 | Pfeifer et al. | 323/282 |
| 6,091,238 A | 7/2000 | McDermott | 324/207.2 |
| 6,091,245 A | 7/2000 | Bertness | 324/426 |
| 6,094,033 A | 7/2000 | Ding et al. | 320/132 |
| 6,097,193 A | 8/2000 | Bramwell | 324/429 |
| 6,100,670 A | 8/2000 | Levesque | 320/150 |
| 6,100,815 A | 8/2000 | Pailthorp | 324/754.07 |
| 6,104,167 A | 8/2000 | Bertness et al. | 320/132 |
| 6,113,262 A | 9/2000 | Purola et al. | 374/45 |
| 6,114,834 A | 9/2000 | Parise | 320/109 |
| 6,118,252 A | 9/2000 | Richter | |
| 6,121,880 A | 9/2000 | Scott et al. | 340/572.5 |
| 6,130,519 A | 10/2000 | Whiting et al. | |
| 6,136,914 A | 10/2000 | Hergenrother et al. | 524/495 |
| 6,137,261 A * | 10/2000 | Kurle | H02J 7/0045 320/132 |
| 6,137,269 A | 10/2000 | Champlin | 320/150 |
| 6,140,797 A | 10/2000 | Dunn | 320/105 |
| 6,141,608 A | 10/2000 | Rother | 701/29.6 |
| 6,144,185 A | 11/2000 | Dougherty et al. | 320/132 |
| 6,147,598 A | 11/2000 | Murphy et al. | 340/426.19 |
| 6,149,653 A | 11/2000 | Deslauriers | 606/232 |
| 6,150,793 A | 11/2000 | Lesesky et al. | 320/104 |
| 6,158,000 A | 12/2000 | Collins | 713/1 |
| 6,161,640 A | 12/2000 | Yamaguchi | 180/65.8 |
| 6,163,156 A | 12/2000 | Bertness | 324/426 |
| 6,164,063 A | 12/2000 | Mendler | 60/274 |
| 6,167,349 A | 12/2000 | Alvarez | 702/63 |
| 6,172,483 B1 | 1/2001 | Champlin | 320/134 |
| 6,172,505 B1 | 1/2001 | Bertness | 324/430 |
| 6,177,737 B1 | 1/2001 | Palfey et al. | 307/64 |
| 6,177,878 B1 | 1/2001 | Tamura | |
| 6,181,545 B1 | 1/2001 | Amatucci et al. | 361/502 |
| 6,184,655 B1 | 2/2001 | Malackowski | 320/116 |
| 6,184,656 B1 | 2/2001 | Karunasiri et al. | 320/119 |
| 6,191,557 B1 | 2/2001 | Gray et al. | 320/132 |
| 6,202,739 B1 | 3/2001 | Pal et al. | 165/104.33 |
| 6,211,651 B1 | 4/2001 | Nemoto | 320/133 |
| 6,211,653 B1 | 4/2001 | Stasko | 320/132 |
| 6,215,275 B1 | 4/2001 | Bean | 320/106 |
| 6,218,805 B1 | 4/2001 | Melcher | 320/105 |
| 6,218,936 B1 | 4/2001 | Imao | 340/447 |
| 6,222,342 B1 | 4/2001 | Eggert et al. | 320/105 |
| 6,222,369 B1 | 4/2001 | Champlin | 324/430 |
| D442,503 S | 5/2001 | Lundbeck et al. | D10/77 |
| 6,225,808 B1 | 5/2001 | Varghese et al. | 324/426 |
| 6,225,898 B1 | 5/2001 | Kamiya et al. | 340/505 |
| 6,236,186 B1 | 5/2001 | Helton et al. | 320/106 |

(56) References Cited

U.S. PATENT DOCUMENTS

| | | | |
|---|---|---|---|
| 6,236,332 B1 | 5/2001 | Conkright et al. | 340/3.1 |
| 6,236,949 B1 | 5/2001 | Hart | 702/64 |
| 6,238,253 B1 | 5/2001 | Qualls | 439/759 |
| 6,242,887 B1 | 6/2001 | Burke | 320/104 |
| 6,242,921 B1 | 6/2001 | Thibedeau et al. | 324/429 |
| 6,249,124 B1 | 6/2001 | Bertness | 324/426 |
| 6,250,973 B1 | 6/2001 | Lowery et al. | 439/763 |
| 6,252,942 B1 | 6/2001 | Zoiss | 379/19 |
| 6,254,438 B1 | 7/2001 | Gaunt | 439/755 |
| 6,255,826 B1 | 7/2001 | Ohsawa | 320/116 |
| 6,259,170 B1 | 7/2001 | Limoge et al. | 307/10.8 |
| 6,259,254 B1 | 7/2001 | Klang | 324/427 |
| 6,262,563 B1 | 7/2001 | Champlin | 320/134 |
| 6,262,692 B1 | 7/2001 | Babb | 343/895 |
| 6,263,268 B1 | 7/2001 | Nathanson | 701/29 |
| 6,263,322 B1 | 7/2001 | Kirkevold et al. | 705/400 |
| 6,271,643 B1 | 8/2001 | Becker et al. | 320/112 |
| 6,271,748 B1 | 8/2001 | Derbyshire et al. | 340/442 |
| 6,272,387 B1 | 8/2001 | Yoon | 700/83 |
| 6,275,008 B1 | 8/2001 | Arai et al. | 320/132 |
| 6,285,191 B1 | 9/2001 | Gollomp et al. | 324/427 |
| 6,294,896 B1 | 9/2001 | Champlin | 320/134 |
| 6,294,897 B1 | 9/2001 | Champlin | 320/153 |
| 6,304,087 B1 | 10/2001 | Bertness | 324/426 |
| 6,307,349 B1 | 10/2001 | Koenck et al. | 320/112 |
| 6,310,481 B2 | 10/2001 | Bertness | 324/430 |
| 6,313,607 B1 | 11/2001 | Champlin | 320/132 |
| 6,313,608 B1 | 11/2001 | Varghese et al. | 320/132 |
| 6,316,914 B1 | 11/2001 | Bertness | 320/134 |
| 6,320,385 B1 | 11/2001 | Ng et al. | 320/104 |
| 6,323,650 B1 | 11/2001 | Bertness et al. | 324/426 |
| 6,324,042 B1 | 11/2001 | Andrews | 361/93.2 |
| 6,329,793 B1 | 12/2001 | Bertness et al. | 320/132 |
| 6,331,762 B1 | 12/2001 | Bertness | 320/134 |
| 6,332,113 B1 | 12/2001 | Bertness | 702/63 |
| 6,346,795 B2 | 2/2002 | Haraguchi et al. | 320/136 |
| 6,347,958 B1 | 2/2002 | Tsai | 439/488 |
| 6,351,102 B1 | 2/2002 | Troy | 320/139 |
| 6,356,042 B1 | 3/2002 | Kahlon et al. | 318/138 |
| 6,356,083 B1 | 3/2002 | Ying | 324/426 |
| 6,359,441 B1 | 3/2002 | Bertness | 324/426 |
| 6,359,442 B1 | 3/2002 | Henningson et al. | 324/426 |
| 6,363,303 B1 | 3/2002 | Bertness | 701/29 |
| RE37,677 E | 4/2002 | Irie | 315/83 |
| 6,377,031 B1 | 4/2002 | Karuppana et al. | 323/220 |
| 6,384,608 B1 | 5/2002 | Namaky | 324/430 |
| 6,388,448 B1 | 5/2002 | Cervas | 324/426 |
| 6,389,337 B1 | 5/2002 | Kolls | 701/31.6 |
| 6,392,414 B2 | 5/2002 | Bertness | 324/429 |
| 6,396,278 B1 | 5/2002 | Makhija | 324/402 |
| 6,407,554 B1 | 6/2002 | Godau et al. | 324/503 |
| 6,411,098 B1 | 6/2002 | Laletin | 324/436 |
| 6,417,669 B1 | 7/2002 | Champlin | 324/426 |
| 6,420,852 B1 | 7/2002 | Sato | 320/134 |
| 6,424,157 B1 | 7/2002 | Gollomp et al. | 324/430 |
| 6,424,158 B2 | 7/2002 | Klang | 324/433 |
| 6,433,512 B1 | 8/2002 | Birkler et al. | 320/132 |
| 6,437,957 B1 | 8/2002 | Karuppana et al. | 361/78 |
| 6,441,585 B1 | 8/2002 | Bertness | 320/132 |
| 6,445,158 B1 | 9/2002 | Bertness et al. | 320/104 |
| 6,448,778 B1 | 9/2002 | Rankin | 324/503 |
| 6,449,726 B1 | 9/2002 | Smith | 713/340 |
| 6,456,036 B1 | 9/2002 | Thandiwe | 320/106 |
| 6,456,045 B1 | 9/2002 | Troy et al. | 320/139 |
| 6,465,908 B1 | 10/2002 | Karuppana et al. | 307/31 |
| 6,466,025 B1 | 10/2002 | Klang | 324/429 |
| 6,466,026 B1 | 10/2002 | Champlin | 324/430 |
| 6,469,511 B1 | 10/2002 | Vonderhaar et al. | 324/425 |
| 6,473,659 B1 | 10/2002 | Shah et al. | 700/79 |
| 6,477,478 B1 | 11/2002 | Jones et al. | 702/102 |
| 6,495,990 B2 | 12/2002 | Champlin | 320/132 |
| 6,497,209 B1 | 12/2002 | Karuppana et al. | 123/179.3 |
| 6,500,025 B1 | 12/2002 | Moenkhaus et al. | 439/502 |
| 6,501,243 B1 | 12/2002 | Kaneko | 318/139 |
| 6,505,507 B1 | 1/2003 | Imao | 73/146.5 |
| 6,507,196 B2 | 1/2003 | Thomsen et al. | 324/436 |
| 6,526,361 B1 | 2/2003 | Jones et al. | 702/63 |
| 6,529,723 B1 | 3/2003 | Bentley | 455/405 |
| 6,531,847 B1 | 3/2003 | Tsukamoto et al. | |
| 6,531,848 B1 | 3/2003 | Chitsazan et al. | 320/153 |
| 6,532,425 B1 | 3/2003 | Boost et al. | 702/63 |
| 6,533,316 B2 | 3/2003 | Breed et al. | 280/735 |
| 6,534,992 B2 | 3/2003 | Meissner et al. | 324/426 |
| 6,534,993 B2 | 3/2003 | Bertness | 324/433 |
| 6,536,536 B1 | 3/2003 | Gass et al. | 173/2 |
| 6,544,078 B2 | 4/2003 | Palmisano et al. | 439/762 |
| 6,545,599 B2 | 4/2003 | Derbyshire et al. | 340/442 |
| 6,556,019 B2 | 4/2003 | Bertness | 324/426 |
| 6,566,883 B1 | 5/2003 | Vonderhaar et al. | 324/426 |
| 6,570,385 B1 | 5/2003 | Roberts et al. | 324/378 |
| 6,573,685 B2 | 6/2003 | Nakanishi et al. | |
| 6,577,107 B2 | 6/2003 | Kechmire | 320/139 |
| 6,586,941 B2 | 7/2003 | Bertness et al. | 324/426 |
| 6,597,150 B1 | 7/2003 | Bertness et al. | 320/104 |
| 6,599,243 B2 | 7/2003 | Woltermann et al. | 600/300 |
| 6,600,815 B1 | 7/2003 | Walding | 379/93.07 |
| 6,611,740 B2 | 8/2003 | Lowrey et al. | 701/29 |
| 6,614,349 B1 | 9/2003 | Proctor et al. | 340/572.1 |
| 6,618,644 B2 | 9/2003 | Bean | 700/231 |
| 6,621,272 B2 | 9/2003 | Champlin | 324/426 |
| 6,623,314 B1 | 9/2003 | Cox et al. | 439/759 |
| 6,624,635 B1 | 9/2003 | Lui | 24/426 |
| 6,628,011 B2 | 9/2003 | Droppo et al. | 307/43 |
| 6,629,054 B2 | 9/2003 | Makhija et al. | 702/113 |
| 6,633,165 B2 | 10/2003 | Bertness | 324/426 |
| 6,635,974 B1 | 10/2003 | Karuppana et al. | 307/140 |
| 6,636,790 B1 | 10/2003 | Lightner et al. | 701/31.5 |
| 6,667,624 B1 | 12/2003 | Raichle et al. | 324/522 |
| 6,679,212 B2 | 1/2004 | Kelling | 123/179.28 |
| 6,686,542 B2 | 2/2004 | Zhang | 174/74 |
| 6,696,819 B2 | 2/2004 | Bertness | 320/134 |
| 6,707,303 B2 | 3/2004 | Bertness et al. | 324/426 |
| 6,732,031 B1 | 5/2004 | Lightner et al. | 701/31.4 |
| 6,736,941 B2 | 5/2004 | Oku et al. | 203/68 |
| 6,737,831 B2 | 5/2004 | Champlin | 320/132 |
| 6,738,697 B2 | 5/2004 | Breed | 701/29 |
| 6,740,990 B2 | 5/2004 | Tozuka et al. | 307/9.1 |
| 6,744,149 B1 | 6/2004 | Karuppana et al. | 307/31 |
| 6,745,153 B2 | 6/2004 | White et al. | 702/184 |
| 6,759,849 B2 | 7/2004 | Bertness | 324/426 |
| 6,771,073 B2 | 8/2004 | Henningson et al. | 324/426 |
| 6,777,945 B2 | 8/2004 | Roberts et al. | 324/426 |
| 6,781,344 B1 | 8/2004 | Hedegor et al. | 320/106 |
| 6,781,382 B2 | 8/2004 | Johnson | 324/426 |
| 6,784,635 B2 | 8/2004 | Larson | 320/104 |
| 6,784,637 B2 | 8/2004 | Raichle et al. | 320/107 |
| 6,788,025 B2 | 9/2004 | Bertness et al. | 320/104 |
| 6,795,782 B2 | 9/2004 | Bertness et al. | 702/63 |
| 6,796,841 B1 | 9/2004 | Cheng et al. | 439/620.3 |
| 6,805,090 B2 | 10/2004 | Bertness et al. | 123/198 |
| 6,806,716 B2 | 10/2004 | Bertness et al. | 324/426 |
| 6,825,669 B2 | 11/2004 | Raichle et al. | 324/426 |
| 6,832,141 B2 | 12/2004 | Skeen et al. | 701/31.4 |
| 6,842,707 B2 | 1/2005 | Raichle et al. | 702/62 |
| 6,845,279 B1 | 1/2005 | Gilmore et al. | 700/115 |
| 6,850,037 B2 | 2/2005 | Bertness | 320/132 |
| 6,856,162 B1 | 2/2005 | Greatorex et al. | 324/764.01 |
| 6,856,972 B1 | 2/2005 | Yun et al. | 705/36 R |
| 6,871,151 B2 | 3/2005 | Bertness | 702/63 |
| 6,885,195 B2 | 4/2005 | Bertness | 324/426 |
| 6,888,468 B2 | 5/2005 | Bertness | 340/636.15 |
| 6,891,378 B2 | 5/2005 | Bertness et al. | 324/426 |
| 6,895,809 B2 | 5/2005 | Raichle | 73/119 |
| 6,904,796 B2 | 6/2005 | Pacsai et al. | 73/146.8 |
| 6,906,522 B2 | 6/2005 | Bertness et al. | 324/426 |
| 6,906,523 B2 | 6/2005 | Bertness et al. | 324/426 |
| 6,906,624 B2 | 6/2005 | McClelland et al. | 340/442 |
| 6,909,287 B2 | 6/2005 | Bertness | 324/427 |
| 6,909,356 B2 | 6/2005 | Brown et al. | 340/3.2 |
| 6,911,825 B2 | 6/2005 | Namaky | 324/426 |
| 6,913,483 B2 | 7/2005 | Restaino et al. | 439/504 |
| 6,914,413 B2 | 7/2005 | Bertness et al. | 320/104 |
| 6,919,725 B2 | 7/2005 | Bertness et al. | 324/433 |
| 6,930,485 B2 | 8/2005 | Bertness et al. | 324/426 |

(56) References Cited

U.S. PATENT DOCUMENTS

| | | |
|---|---|---|
| 6,933,727 B2 | 8/2005 | Bertness et al. ............... 324/426 |
| 6,941,234 B2 | 9/2005 | Bertness et al. ............... 702/63 |
| 6,957,133 B1 | 10/2005 | Hunt et al. ............... 701/32.4 |
| 6,961,445 B1 | 11/2005 | Jensen et al. |
| 6,966,676 B2 | 11/2005 | Chabert et al. |
| 6,967,484 B2 | 11/2005 | Bertness ............... 324/426 |
| 6,972,662 B1 | 12/2005 | Ohkawa et al. ............... 340/10.1 |
| 6,983,212 B2 | 1/2006 | Burns ............... 702/63 |
| 6,988,053 B2 | 1/2006 | Namaky ............... 320/104 |
| 6,993,421 B2 | 1/2006 | Pillar et al. ............... 701/29.4 |
| 6,998,847 B2 | 2/2006 | Bertness et al. ............... 324/426 |
| 7,003,410 B2 | 2/2006 | Bertness et al. ............... 702/63 |
| 7,003,411 B2 | 2/2006 | Bertness ............... 702/63 |
| 7,012,433 B2 | 3/2006 | Smith et al. ............... 324/426 |
| 7,015,674 B2 | 3/2006 | VonderHaar ............... 320/103 |
| 7,029,338 B1 | 4/2006 | Orange et al. ............... 439/755 |
| 7,034,541 B2 | 4/2006 | Bertness et al. ............... 324/426 |
| 7,039,533 B2 | 5/2006 | Bertness et al. ............... 702/63 |
| 7,042,346 B2 | 5/2006 | Paulsen ............... 340/438 |
| 7,049,822 B2 | 5/2006 | Kung ............... 324/426 |
| 7,058,525 B2 | 6/2006 | Bertness et al. ............... 702/63 |
| 7,069,979 B2 | 7/2006 | Tobias ............... 165/104.33 |
| 7,081,755 B2 | 7/2006 | Klang et al. ............... 324/426 |
| 7,089,127 B2 | 8/2006 | Thibedeau et al. ............... 702/63 |
| 7,098,666 B2 | 8/2006 | Patino ............... 324/433 |
| 7,102,556 B2 | 9/2006 | White ............... 341/141 |
| 7,106,070 B2 | 9/2006 | Bertness et al. ............... 324/538 |
| 7,116,109 B2 | 10/2006 | Klang ............... 324/426 |
| 7,119,686 B2 | 10/2006 | Bertness et al. ............... 340/572.1 |
| 7,120,488 B2 | 10/2006 | Nova et al. ............... 600/2 |
| 7,126,341 B2 | 10/2006 | Bertness et al. ............... 324/426 |
| 7,129,706 B2 | 10/2006 | Kalley ............... 324/426 |
| 7,154,276 B2 | 12/2006 | Bertness ............... 324/503 |
| 7,170,393 B2 | 1/2007 | Martin ............... 340/10.1 |
| 7,173,182 B2 | 2/2007 | Katsuyama ............... 174/36 |
| 7,177,222 B2 | 2/2007 | Carcido et al. ............... 709/223 |
| 7,182,147 B2 | 2/2007 | Cutler et al. ............... 173/1 |
| 7,184,866 B2 | 2/2007 | Squires ............... 340/426.15 |
| 7,184,905 B2 | 2/2007 | Stefan ............... 702/63 |
| 7,198,510 B2 | 4/2007 | Bertness ............... 439/500 |
| 7,200,424 B2 | 4/2007 | Tischer et al. ............... 455/567 |
| 7,202,636 B2 | 4/2007 | Reynolds et al. ............... 320/166 |
| 7,208,914 B2 | 4/2007 | Klang ............... 320/132 |
| 7,209,850 B2 | 4/2007 | Brott et al. ............... 324/426 |
| 7,209,860 B2 | 4/2007 | Trsar et al. ............... 702/183 |
| 7,212,887 B2 | 5/2007 | Shah et al. ............... 700/276 |
| 7,212,911 B2 | 5/2007 | Raichle et al. ............... 701/114 |
| 7,219,023 B2 | 5/2007 | Banke et al. ............... 702/58 |
| 7,233,128 B2 | 6/2007 | Brost et al. ............... 320/132 |
| 7,235,977 B2 | 6/2007 | Koran et al. ............... 324/426 |
| 7,246,015 B2 | 7/2007 | Bertness et al. ............... 702/63 |
| 7,251,551 B2 | 7/2007 | Mitsueda ............... 700/2 |
| 7,272,519 B2 | 9/2007 | Lesesky et al. ............... 702/63 |
| 7,287,001 B1 | 10/2007 | Falls et al. ............... 705/22 |
| 7,295,936 B2 | 11/2007 | Bertness et al. ............... 702/63 |
| 7,301,303 B1 | 11/2007 | Hulden ............... 320/103 |
| 7,319,304 B2 | 1/2008 | Veloo et al. ............... 320/134 |
| 7,339,477 B2 | 3/2008 | Puzio et al. ............... 340/572.1 |
| 7,363,175 B2 | 4/2008 | Bertness et al. ............... 702/63 |
| 7,376,497 B2 | 5/2008 | Chen ............... 701/31.6 |
| 7,398,176 B2 | 7/2008 | Bertness |
| 7,408,358 B2 | 8/2008 | Knopf ............... 324/426 |
| 7,425,833 B2 | 9/2008 | Bertness et al. ............... 324/426 |
| 7,446,536 B2 | 11/2008 | Bertness ............... 324/426 |
| 7,453,238 B2 | 11/2008 | Melichar ............... 320/132 |
| 7,479,763 B2 | 1/2009 | Bertness ............... 320/134 |
| 7,498,767 B2 | 3/2009 | Brown et al. ............... 320/107 |
| 7,501,795 B2 | 3/2009 | Bertness et al. ............... 320/134 |
| 7,504,830 B2 | 3/2009 | Keuss |
| 7,505,856 B2 | 3/2009 | Restaino et al. ............... 702/63 |
| 7,538,571 B2 | 5/2009 | Raichle et al. ............... 324/772 |
| 7,545,146 B2 | 6/2009 | Klang et al. ............... 324/426 |
| 7,557,586 B1 | 7/2009 | Vonderhaar et al. ............... 324/437 |
| 7,571,035 B2 | 8/2009 | Raichle |
| 7,590,476 B2 | 9/2009 | Shumate ............... 701/31.6 |
| 7,592,776 B2 | 9/2009 | Tsukamoto et al. ............... 320/136 |
| 7,595,643 B2 | 9/2009 | Klang ............... 324/426 |
| 7,596,437 B1 | 9/2009 | Hunt et al. |
| 7,598,699 B2 | 10/2009 | Restaino et al. ............... 320/105 |
| 7,598,743 B2 | 10/2009 | Bertness ............... 324/426 |
| 7,598,744 B2 | 10/2009 | Bertness et al. ............... 324/426 |
| 7,619,417 B2 | 11/2009 | Klang ............... 324/427 |
| 7,642,786 B2 | 1/2010 | Philbrook ............... 324/426 |
| 7,642,787 B2 | 1/2010 | Bertness et al. ............... 324/426 |
| 7,656,162 B2 | 2/2010 | Vonderhaar et al. ............... 324/426 |
| 7,657,386 B2 | 2/2010 | Thibedeau et al. ............... 702/63 |
| 7,667,437 B2 | 2/2010 | Johnson et al. ............... 320/150 |
| 7,679,325 B2 | 3/2010 | Seo ............... 320/116 |
| 7,684,908 B1 | 3/2010 | Ogilvie et al. ............... 701/29.6 |
| 7,688,074 B2 | 3/2010 | Cox et al. ............... 324/426 |
| 7,690,573 B2 | 4/2010 | Raichle et al. ............... 235/462 |
| 7,696,759 B2 | 4/2010 | Raichle et al. ............... 324/538 |
| 7,698,179 B2 | 4/2010 | Leung et al. ............... 705/28 |
| 7,705,602 B2 | 4/2010 | Bertness ............... 324/426 |
| 7,706,991 B2 | 4/2010 | Bertness et al. ............... 702/63 |
| 7,706,992 B2 | 4/2010 | Ricci et al. |
| 7,710,119 B2 | 5/2010 | Bertness ............... 324/426 |
| 7,723,993 B2 | 5/2010 | Klang ............... 324/431 |
| 7,728,556 B2 | 6/2010 | Yano et al. ............... 320/134 |
| 7,728,597 B2 | 6/2010 | Bertness ............... 324/426 |
| 7,729,880 B1 | 6/2010 | Mashburn ............... 702/151 |
| 7,743,788 B2 | 6/2010 | Schmitt ............... 137/554 |
| 7,751,953 B2 | 7/2010 | Namaky ............... 701/33.2 |
| 7,772,850 B2 | 8/2010 | Bertness ............... 324/426 |
| 7,774,130 B2 | 8/2010 | Pepper ............... 340/439 |
| 7,774,151 B2 | 8/2010 | Bertness ............... 702/63 |
| 7,777,612 B2 | 8/2010 | Sampson et al. ............... 340/426.1 |
| 7,791,348 B2 | 9/2010 | Brown et al. ............... 324/426 |
| 7,808,375 B2 | 10/2010 | Bertness et al. ............... 340/455 |
| 7,848,857 B2 | 12/2010 | Nasr et al. ............... 701/22 |
| 7,883,002 B2 | 2/2011 | Jin et al. ............... 235/376 |
| 7,902,990 B2 | 3/2011 | Delmonico et al. ............... 340/636.1 |
| 7,914,350 B1 | 3/2011 | Bozich ............... 439/506 |
| 7,924,015 B2 | 4/2011 | Bertness ............... 324/427 |
| 7,940,052 B2 | 5/2011 | Vonderhaar |
| 7,940,053 B2 | 5/2011 | Brown et al. ............... 324/426 |
| 7,959,476 B2 | 6/2011 | Smith et al. |
| 7,977,914 B2 | 7/2011 | Bertness |
| D643,759 S | 8/2011 | Bertness |
| 7,990,155 B2 | 8/2011 | Henningson ............... 324/429 |
| 7,999,505 B2 | 8/2011 | Bertness ............... 320/104 |
| 8,024,083 B2 | 9/2011 | Chenn ............... 701/2 |
| 8,047,868 B1 | 11/2011 | Korcynski ............... 439/522 |
| 8,164,343 B2 | 4/2012 | Bertness ............... 324/503 |
| 8,198,900 B2 | 6/2012 | Bertness et al. |
| 8,203,345 B2 | 6/2012 | Bertness |
| 8,222,868 B2 | 7/2012 | Buckner ............... 320/136 |
| 8,226,008 B2 | 7/2012 | Raichle et al. ............... 235/462.13 |
| 8,237,448 B2 | 8/2012 | Bertness |
| 8,306,690 B2 | 11/2012 | Bertness ............... 701/34.4 |
| 8,310,271 B2 | 11/2012 | Raichle et al. ............... 324/765.01 |
| 8,344,685 B2 | 1/2013 | Bertness et al. |
| 8,436,619 B2 | 5/2013 | Bertness et al. |
| 8,442,877 B2 | 5/2013 | Bertness et al. |
| 8,449,560 B2 | 5/2013 | Roth ............... 227/175.1 |
| 8,493,022 B2 | 7/2013 | Bertness |
| D687,727 S | 8/2013 | Kehoe et al. |
| 8,509,212 B2 | 8/2013 | Sanjeev |
| 8,513,949 B2 | 8/2013 | Bertness |
| 8,594,957 B2 | 11/2013 | Gauthier ............... 324/548 |
| 8,674,654 B2 | 3/2014 | Bertness |
| 8,674,711 B2 | 3/2014 | Bertness |
| 8,704,483 B2 | 4/2014 | Bertness et al. |
| 8,738,309 B2 | 5/2014 | Bertness |
| 8,754,653 B2 | 6/2014 | Volderhaar et al. |
| 8,810,200 B2 | 8/2014 | Kondo |
| 8,825,272 B1 | 9/2014 | Chinnadurai |
| 8,827,729 B2 | 9/2014 | Gunreben ............... 439/188 |
| 8,872,516 B2 | 10/2014 | Bertness |
| 8,872,517 B2 | 10/2014 | Philbrook et al. |
| 8,958,998 B2 | 2/2015 | Bertness |
| 8,963,550 B2 | 2/2015 | Bertness et al. |
| 9,018,958 B2 | 4/2015 | Bertness |
| 9,037,394 B2 | 5/2015 | Fernandes ............... 701/400 |

(56) References Cited

U.S. PATENT DOCUMENTS

| | | | |
|---|---|---|---|
| 9,052,366 B2 | 6/2015 | Bertness | |
| 9,056,556 B1 | 6/2015 | Hyde et al. | |
| 9,166,261 B2 | 10/2015 | Ibi | |
| 9,201,120 B2 | 12/2015 | Stukenburg | |
| 9,229,062 B2 | 1/2016 | Stukenberg | |
| 9,244,100 B2 | 1/2016 | Coleman et al. | |
| 9,255,955 B2 | 2/2016 | Bertness | 324/503 |
| 9,274,157 B2 | 3/2016 | Bertness | |
| 9,312,575 B2 | 4/2016 | Stukenberg | |
| 9,335,362 B2 | 5/2016 | Bertness | |
| 9,419,311 B2 | 8/2016 | Bertness | |
| 9,425,487 B2 | 8/2016 | Bertness | |
| 9,496,720 B2 | 11/2016 | McShane | |
| 9,588,185 B2 | 3/2017 | Champlin | |
| 9,639,899 B1 | 5/2017 | Gersitz | |
| 9,923,289 B2 | 3/2018 | Bertness | |
| 9,966,676 B2 | 5/2018 | Salo, III et al. | |
| 10,046,649 B2 | 8/2018 | Bertness | |
| 10,222,397 B2 | 3/2019 | Salo et al. | |
| 10,317,468 B2 | 6/2019 | Bertness | |
| 10,429,449 B2 | 10/2019 | Arnoldus | |
| 10,473,555 B2 | 11/2019 | Bertness | |
| 10,525,841 B2 | 1/2020 | Zhou et al. | |
| 10,608,353 B2 | 3/2020 | Lipkin et al. | |
| 10,843,574 B2 | 11/2020 | Palmisano et al. | |
| 11,325,479 B2 | 5/2022 | Bertness | |
| 2001/0012738 A1 | 8/2001 | Duperret | 439/835 |
| 2001/0033169 A1 | 10/2001 | Singh | 324/426 |
| 2001/0035737 A1 | 11/2001 | Nakanishi et al. | 320/122 |
| 2001/0048215 A1 | 12/2001 | Breed et al. | 280/728.1 |
| 2001/0048226 A1 | 12/2001 | Nada | 290/40 |
| 2002/0003423 A1 | 1/2002 | Bertness et al. | 324/426 |
| 2002/0004694 A1 | 1/2002 | McLeod | 701/29 |
| 2002/0007237 A1 | 1/2002 | Phung et al. | 701/33 |
| 2002/0010558 A1 | 1/2002 | Bertness et al. | 702/63 |
| 2002/0021135 A1 | 2/2002 | Li et al. | 324/677 |
| 2002/0027346 A1 | 3/2002 | Breed et al. | 280/735 |
| 2002/0030495 A1 | 3/2002 | Kechmire | 324/427 |
| 2002/0036504 A1 | 3/2002 | Troy et al. | 324/430 |
| 2002/0041175 A1 | 4/2002 | Lauper et al. | 320/106 |
| 2002/0044050 A1 | 4/2002 | Derbyshire et al. | 340/442 |
| 2002/0047711 A1 | 4/2002 | Bertness et al. | 324/426 |
| 2002/0050163 A1 | 5/2002 | Makhija et al. | 73/116 |
| 2002/0065619 A1 | 5/2002 | Bertness | 702/63 |
| 2002/0074398 A1 | 6/2002 | Lancos et al. | 235/382 |
| 2002/0116140 A1 | 8/2002 | Rider | 702/63 |
| 2002/0118111 A1 | 8/2002 | Brown et al. | 340/573.1 |
| 2002/0121877 A1 | 9/2002 | Smith et al. | |
| 2002/0121901 A1 | 9/2002 | Hoffman | 324/426 |
| 2002/0128985 A1 | 9/2002 | Greenwald | 705/400 |
| 2002/0130665 A1 | 9/2002 | Bertness et al. | 324/426 |
| 2002/0152791 A1 | 10/2002 | Cardinale | |
| 2002/0153864 A1 | 10/2002 | Bertness | 320/132 |
| 2002/0171428 A1 | 11/2002 | Bertness | 702/63 |
| 2002/0176010 A1 | 11/2002 | Wallach et al. | 348/362 |
| 2002/0193955 A1 | 12/2002 | Bertness | 702/63 |
| 2003/0006779 A1 | 1/2003 | Youval | 324/503 |
| 2003/0009270 A1 | 1/2003 | Breed | 701/29 |
| 2003/0017753 A1 | 1/2003 | Palmisano et al. | 439/762 |
| 2003/0025481 A1 | 2/2003 | Bertness | 324/427 |
| 2003/0030442 A1 | 2/2003 | Sugimoto | 324/429 |
| 2003/0036909 A1 | 2/2003 | Kato | 704/275 |
| 2003/0040873 A1 | 2/2003 | Lesesky et al. | 702/57 |
| 2003/0060953 A1 | 3/2003 | Chen | 701/33 |
| 2003/0078743 A1 | 4/2003 | Bertness et al. | 702/63 |
| 2003/0088375 A1 | 5/2003 | Bertness et al. | 702/63 |
| 2003/0090272 A1 | 5/2003 | Bertness | 324/426 |
| 2003/0114206 A1 | 6/2003 | Timothy | 455/575.7 |
| 2003/0124417 A1 | 7/2003 | Bertness et al. | 429/90 |
| 2003/0128011 A1 | 7/2003 | Bertness et al. | |
| 2003/0128036 A1 | 7/2003 | Henningson et al. | 324/426 |
| 2003/0137277 A1 | 7/2003 | Mori et al. | 320/132 |
| 2003/0155930 A1 | 8/2003 | Thomsen | |
| 2003/0164073 A1 | 9/2003 | Chen | |
| 2003/0169018 A1 | 9/2003 | Berels et al. | 320/132 |
| 2003/0169019 A1 | 9/2003 | Oosaki | 320/132 |
| 2003/0171111 A1 | 9/2003 | Clark | 455/414.1 |
| 2003/0173971 A1 | 9/2003 | Bertness | 324/441 |
| 2003/0177417 A1 | 9/2003 | Malhotra et al. | 714/42 |
| 2003/0184262 A1 | 10/2003 | Makhija | 320/156 |
| 2003/0184264 A1 | 10/2003 | Bertness | |
| 2003/0184306 A1 | 10/2003 | Bertness et al. | 324/426 |
| 2003/0187556 A1 | 10/2003 | Suzuki | 701/29 |
| 2003/0194672 A1 | 10/2003 | Roberts et al. | 431/196 |
| 2003/0197512 A1 | 10/2003 | Miller et al. | 324/426 |
| 2003/0212311 A1 | 11/2003 | Nova et al. | 600/300 |
| 2003/0214395 A1 | 11/2003 | Flowerday et al. | 340/445 |
| 2003/0224241 A1 | 12/2003 | Takada et al. | 429/52 |
| 2003/0236656 A1 | 12/2003 | Dougherty | 703/14 |
| 2004/0000590 A1 | 1/2004 | Raichle et al. | 235/462.01 |
| 2004/0000891 A1 | 1/2004 | Raichle et al. | 320/107 |
| 2004/0000893 A1 | 1/2004 | Raichle et al. | 320/135 |
| 2004/0000913 A1 | 1/2004 | Raichle et al. | 324/426 |
| 2004/0000915 A1 | 1/2004 | Raichle et al. | 324/522 |
| 2004/0002824 A1 | 1/2004 | Raichle et al. | 702/63 |
| 2004/0002825 A1 | 1/2004 | Raichle et al. | 702/63 |
| 2004/0002836 A1 | 1/2004 | Raichle et al. | 702/188 |
| 2004/0032264 A1 | 2/2004 | Schoch | 324/426 |
| 2004/0036443 A1 | 2/2004 | Bertness | 320/109 |
| 2004/0044452 A1 | 3/2004 | Bauer et al. | 703/33 |
| 2004/0044454 A1 | 3/2004 | Ross et al. | 701/33 |
| 2004/0046564 A1 | 3/2004 | Klang | 324/426 |
| 2004/0049361 A1 | 3/2004 | Hamdan et al. | 702/115 |
| 2004/0051532 A1 | 3/2004 | Smith et al. | 324/426 |
| 2004/0051533 A1 | 3/2004 | Namaky | 324/426 |
| 2004/0051534 A1 | 3/2004 | Kobayashi et al. | 324/429 |
| 2004/0054503 A1 | 3/2004 | Namaky | 702/182 |
| 2004/0064225 A1 | 4/2004 | Jammu et al. | 701/29 |
| 2004/0065489 A1 | 4/2004 | Aberle | 180/65.1 |
| 2004/0088087 A1 | 5/2004 | Fukushima et al. | 701/32 |
| 2004/0104728 A1 | 6/2004 | Bertness et al. | 324/429 |
| 2004/0108855 A1 | 6/2004 | Raichle | 324/378 |
| 2004/0108856 A1 | 6/2004 | Johnson | 324/426 |
| 2004/0113494 A1 | 6/2004 | Karuppana et al. | |
| 2004/0113588 A1 | 6/2004 | Mikuriya et al. | 320/128 |
| 2004/0145342 A1 | 7/2004 | Lyon | 320/108 |
| 2004/0145371 A1 | 7/2004 | Bertness | 324/426 |
| 2004/0150494 A1 | 8/2004 | Yoshida | 333/243 |
| 2004/0157113 A1 | 8/2004 | Klang | 429/50 |
| 2004/0164706 A1 | 8/2004 | Osborne | 320/116 |
| 2004/0172177 A1 | 9/2004 | Nagai et al. | 701/29 |
| 2004/0178185 A1 | 9/2004 | Yoshikawa et al. | 219/270 |
| 2004/0189309 A1 | 9/2004 | Bertness et al. | 324/426 |
| 2004/0199343 A1 | 10/2004 | Cardinal et al. | 702/63 |
| 2004/0207367 A1 | 10/2004 | Taniguchi et al. | 320/149 |
| 2004/0221641 A1 | 11/2004 | Moritsugu | 73/23.31 |
| 2004/0227523 A1 | 11/2004 | Namaky | 324/537 |
| 2004/0239332 A1 | 12/2004 | Mackel et al. | 324/426 |
| 2004/0251876 A1 | 12/2004 | Bertness et al. | 320/136 |
| 2004/0251907 A1 | 12/2004 | Kalley | |
| 2004/0257084 A1 | 12/2004 | Restaino | 324/400 |
| 2005/0007068 A1 | 1/2005 | Johnson et al. | 320/110 |
| 2005/0009122 A1 | 1/2005 | Whelan et al. | 435/7.32 |
| 2005/0017726 A1 | 1/2005 | Koran et al. | 324/433 |
| 2005/0017952 A1 | 1/2005 | His | 345/169 |
| 2005/0021197 A1 | 1/2005 | Zimmerman | 701/31.4 |
| 2005/0021294 A1 | 1/2005 | Trsar et al. | 702/183 |
| 2005/0021475 A1 | 1/2005 | Bertness | 705/63 |
| 2005/0025299 A1 | 2/2005 | Tischer et al. | 379/199 |
| 2005/0035752 A1 | 2/2005 | Bertness | |
| 2005/0043868 A1 | 2/2005 | Mitcham | 701/29 |
| 2005/0057256 A1 | 3/2005 | Bertness | 324/426 |
| 2005/0060070 A1 | 3/2005 | Kapolka et al. | 701/29 |
| 2005/0073314 A1 | 4/2005 | Bertness et al. | 324/433 |
| 2005/0076381 A1 | 4/2005 | Gross | 725/107 |
| 2005/0077904 A1 | 4/2005 | Bertness | 324/426 |
| 2005/0096809 A1 | 5/2005 | Skeen et al. | 701/29 |
| 2005/0102073 A1 | 5/2005 | Ingram | 701/29 |
| 2005/0119809 A1 | 6/2005 | Chen | 701/33.5 |
| 2005/0128083 A1 | 6/2005 | Puzio et al. | 340/572.1 |
| 2005/0128902 A1 | 6/2005 | Tsai | 369/44.32 |
| 2005/0133245 A1 | 6/2005 | Katsuyama | 174/74 R |
| 2005/0134282 A1 | 6/2005 | Averbuch | 324/426 |
| 2005/0143882 A1 | 6/2005 | Umezawa | 701/29 |

(56) References Cited

U.S. PATENT DOCUMENTS

| | | | |
|---|---|---|---|
| 2005/0159847 A1 | 7/2005 | Shah et al. | 700/276 |
| 2005/0162172 A1 | 7/2005 | Bertness | 324/426 |
| 2005/0168226 A1 | 8/2005 | Quint et al. | 324/426 |
| 2005/0173142 A1 | 8/2005 | Cutler et al. | 173/181 |
| 2005/0182536 A1 | 8/2005 | Doyle et al. | 701/29 |
| 2005/0184732 A1 | 8/2005 | Restaino | 324/426 |
| 2005/0192045 A1 | 9/2005 | Lowles | |
| 2005/0206346 A1 | 9/2005 | Smith et al. | |
| 2005/0212521 A1 | 9/2005 | Bertness | 324/426 |
| 2005/0213874 A1 | 9/2005 | Kline | 385/15 |
| 2005/0218902 A1 | 10/2005 | Restaino et al. | 324/433 |
| 2005/0231205 A1 | 10/2005 | Bertness et al. | 324/426 |
| 2005/0254106 A9 | 11/2005 | Silverbrook et al. | 358/539 |
| 2005/0256617 A1 | 11/2005 | Cawthorne et al. | 701/22 |
| 2005/0258241 A1 | 11/2005 | McNutt et al. | 235/385 |
| 2005/0264296 A1 | 12/2005 | Philbrook | 324/433 |
| 2005/0269880 A1 | 12/2005 | Konishi | 307/10.7 |
| 2005/0273218 A1 | 12/2005 | Breed | 701/2 |
| 2006/0012330 A1 | 1/2006 | Okumura et al. | 320/103 |
| 2006/0017447 A1 | 1/2006 | Bertness | 324/538 |
| 2006/0026017 A1 | 2/2006 | Walkder | 701/31.4 |
| 2006/0030980 A1 | 2/2006 | St Denis | 701/29 |
| 2006/0038572 A1 | 2/2006 | Philbrook | |
| 2006/0043976 A1 | 3/2006 | Gervais | 324/508 |
| 2006/0061469 A1 | 3/2006 | Jaeger | 340/539.13 |
| 2006/0076923 A1 | 4/2006 | Eaves | 320/112 |
| 2006/0079203 A1 | 4/2006 | Nicolini | 455/411 |
| 2006/0089767 A1 | 4/2006 | Sowa | 701/29 |
| 2006/0090554 A1 | 5/2006 | Krampitz | |
| 2006/0090555 A1 | 5/2006 | Krampitz | |
| 2006/0091597 A1 | 5/2006 | Opsahl | |
| 2006/0092584 A1 | 5/2006 | Raichle | |
| 2006/0095230 A1 | 5/2006 | Grier et al. | 702/183 |
| 2006/0102397 A1 | 5/2006 | Buck | 429/432 |
| 2006/0125482 A1 | 6/2006 | Klang | |
| 2006/0136119 A1 | 6/2006 | Raichle | |
| 2006/0139167 A1 | 6/2006 | Davie | |
| 2006/0152224 A1 | 7/2006 | Kim et al. | 324/430 |
| 2006/0155439 A1 | 7/2006 | Slawinski | 701/33.4 |
| 2006/0161313 A1 | 7/2006 | Rogers et al. | 701/1 |
| 2006/0161390 A1 | 7/2006 | Namaky et al. | 702/183 |
| 2006/0217914 A1 | 9/2006 | Bertness | 702/113 |
| 2006/0244457 A1 | 11/2006 | Henningson et al. | 324/426 |
| 2006/0282227 A1 | 12/2006 | Bertness | |
| 2006/0282323 A1 | 12/2006 | Walker et al. | 705/14 |
| 2007/0005201 A1 | 1/2007 | Chenn | 701/31.5 |
| 2007/0024460 A1 | 2/2007 | Clark | 340/663 |
| 2007/0026916 A1 | 2/2007 | Juds et al. | 463/1 |
| 2007/0046261 A1 | 3/2007 | Porebski | 320/132 |
| 2007/0082652 A1 | 4/2007 | Hartigan | |
| 2007/0088472 A1 | 4/2007 | Ganzhorn et al. | 701/33 |
| 2007/0108942 A1 | 5/2007 | Johnson et al. | 320/112 |
| 2007/0159177 A1 | 7/2007 | Bertness et al. | 324/426 |
| 2007/0182576 A1 | 8/2007 | Proska et al. | 340/636.1 |
| 2007/0194791 A1 | 8/2007 | Huang | 324/430 |
| 2007/0194793 A1 | 8/2007 | Bertness | 324/503 |
| 2007/0205752 A1 | 9/2007 | Leigh | 324/500 |
| 2007/0205983 A1 | 9/2007 | Naimo | 345/160 |
| 2007/0210801 A1 | 9/2007 | Krampitz | 324/426 |
| 2007/0244660 A1 | 10/2007 | Bertness | |
| 2007/0259256 A1 | 11/2007 | Le Canut et al. | 429/90 |
| 2007/0279066 A1 | 12/2007 | Chism | 324/437 |
| 2008/0023547 A1 | 1/2008 | Raichle | 235/462.13 |
| 2008/0036421 A1 | 2/2008 | Seo et al. | 320/132 |
| 2008/0053716 A1 | 3/2008 | Scheucher | 180/2.1 |
| 2008/0059014 A1 | 3/2008 | Nasr et al. | 701/22 |
| 2008/0064559 A1 | 3/2008 | Cawthorne | 477/5 |
| 2008/0086246 A1 | 4/2008 | Bolt et al. | 701/29 |
| 2008/0087479 A1 | 4/2008 | Kang | |
| 2008/0094068 A1 | 4/2008 | Scott | 324/426 |
| 2008/0103656 A1 | 5/2008 | Lipscomb | 701/33.4 |
| 2008/0106267 A1 | 5/2008 | Bertness | 320/112 |
| 2008/0169818 A1 | 7/2008 | Lesesky et al. | 324/426 |
| 2008/0179122 A1 | 7/2008 | Sugawara | 180/65.245 |
| 2008/0194984 A1 | 8/2008 | Keefe | 600/559 |
| 2008/0303528 A1 | 12/2008 | Kim | 324/430 |
| 2008/0303529 A1 | 12/2008 | Nakamura et al. | 324/433 |
| 2008/0315830 A1 | 12/2008 | Bertness | 320/104 |
| 2009/0006476 A1 | 1/2009 | Andreasen et al. | 707/104.1 |
| 2009/0011327 A1 | 1/2009 | Okumura et al. | 429/99 |
| 2009/0013521 A1 | 1/2009 | Okumura et al. | 29/730 |
| 2009/0024266 A1 | 1/2009 | Bertness | 701/22 |
| 2009/0024419 A1 | 1/2009 | McClellan | 705/4 |
| 2009/0085571 A1 | 4/2009 | Bertness | 324/426 |
| 2009/0146610 A1 | 6/2009 | Trigiani | |
| 2009/0146800 A1 | 6/2009 | Grimlund et al. | 340/505 |
| 2009/0160395 A1 | 6/2009 | Chen | 320/101 |
| 2009/0184165 A1 | 7/2009 | Bertness et al. | |
| 2009/0198372 A1 | 8/2009 | Hammerslag | 700/226 |
| 2009/0203247 A1 | 8/2009 | Fifelski | 439/345 |
| 2009/0237029 A1 | 9/2009 | Andelfinger | 320/108 |
| 2009/0237086 A1 | 9/2009 | Andelfinger | 324/431 |
| 2009/0247020 A1 | 10/2009 | Gathman et al. | 439/759 |
| 2009/0251151 A1 | 10/2009 | Miyashita | |
| 2009/0259432 A1 | 10/2009 | Liberty | 702/150 |
| 2009/0265121 A1 | 10/2009 | Rocci | 702/57 |
| 2009/0273451 A1 | 11/2009 | Soppera et al. | |
| 2009/0276115 A1 | 11/2009 | Chen | 701/32 |
| 2009/0311919 A1 | 12/2009 | Smith | 439/759 |
| 2010/0023198 A1 | 1/2010 | Hamilton | 701/29 |
| 2010/0039065 A1 | 2/2010 | Kinkade | 320/104 |
| 2010/0052193 A1 | 3/2010 | Sylvester | 261/26 |
| 2010/0066283 A1 | 3/2010 | Kitanaka | 318/400.02 |
| 2010/0088050 A1 | 4/2010 | Keuss | 702/63 |
| 2010/0094496 A1 | 4/2010 | Hershkovitz et al. | |
| 2010/0117603 A1 | 5/2010 | Makhija | 320/162 |
| 2010/0145780 A1 | 6/2010 | Nishikawa et al. | 705/14.11 |
| 2010/0214055 A1 | 8/2010 | Fuji | 340/3.1 |
| 2010/0265131 A1 | 10/2010 | Fabius | |
| 2010/0314950 A1 | 12/2010 | Rutkowski et al. | 307/125 |
| 2011/0004427 A1 | 1/2011 | Gorbold et al. | 702/63 |
| 2011/0015815 A1 | 1/2011 | Bertness | 701/22 |
| 2011/0106280 A1 | 5/2011 | Zeier | 700/90 |
| 2011/0161025 A1 | 6/2011 | Tomura | 702/63 |
| 2011/0215767 A1 | 9/2011 | Johnson et al. | 320/136 |
| 2011/0218747 A1 | 9/2011 | Bertness | 702/63 |
| 2011/0258112 A1 | 10/2011 | Eder et al. | |
| 2011/0265025 A1 | 10/2011 | Bertness | |
| 2011/0267067 A1 | 11/2011 | Bertness et al. | |
| 2011/0273181 A1 | 11/2011 | Park et al. | 324/429 |
| 2011/0294367 A1 | 12/2011 | Moon | 439/878 |
| 2011/0300416 A1 | 12/2011 | Bertness | |
| 2012/0041697 A1 | 2/2012 | Stukenberg | 702/63 |
| 2012/0046807 A1 | 2/2012 | Ruther | 701/2 |
| 2012/0046824 A1 | 2/2012 | Ruther et al. | 701/31.5 |
| 2012/0062237 A1 | 3/2012 | Robinson | 324/433 |
| 2012/0074904 A1 | 3/2012 | Rutkowski et al. | 320/112 |
| 2012/0086399 A1 | 4/2012 | Choi | |
| 2012/0116391 A1 | 5/2012 | Houser | 606/41 |
| 2012/0182132 A1 | 7/2012 | McShane | |
| 2012/0249069 A1 | 10/2012 | Ohtomo | 320/109 |
| 2012/0256494 A1 | 10/2012 | Kesler | 307/104 |
| 2012/0256568 A1 | 10/2012 | Lee | 318/139 |
| 2012/0274331 A1 | 11/2012 | Liu | 324/426 |
| 2012/0293372 A1 | 11/2012 | Amendolare | 342/451 |
| 2013/0099747 A1 | 4/2013 | Baba | 310/118 |
| 2013/0106362 A1 | 5/2013 | Mackintosh et al. | |
| 2013/0106596 A1 | 5/2013 | Mouchet | |
| 2013/0115821 A1 | 5/2013 | Golko | 439/638 |
| 2013/0134926 A1 | 5/2013 | Yoshida | |
| 2013/0158782 A1 | 6/2013 | Bertness et al. | 701/34.4 |
| 2013/0172019 A1 | 7/2013 | Youssef | 455/456.6 |
| 2013/0200855 A1 | 8/2013 | Christensen et al. | |
| 2013/0218781 A1 | 8/2013 | Simon | |
| 2013/0288706 A1 | 10/2013 | Yu | 455/456.1 |
| 2013/0297247 A1 | 11/2013 | Jardine | |
| 2013/0311124 A1 | 11/2013 | Van Bremen | 702/104 |
| 2013/0314041 A1 | 11/2013 | Proebstle | 320/109 |
| 2013/0325405 A1 | 12/2013 | Miller | |
| 2014/0002021 A1 | 1/2014 | Bertness | |
| 2014/0002094 A1 | 1/2014 | Champlin | 324/426 |
| 2014/0029308 A1 | 1/2014 | Cojocaru | 363/13 |
| 2014/0081527 A1 | 3/2014 | Miller | |
| 2014/0099830 A1 | 4/2014 | Byrne | 439/638 |

(56) References Cited

U.S. PATENT DOCUMENTS

| | | | |
|---|---|---|---|
| 2014/0117997 A1 | 5/2014 | Bertness | 324/426 |
| 2014/0145670 A1 | 5/2014 | van Zwan et al. | |
| 2014/0194084 A1 | 7/2014 | Noonan | 455/404.1 |
| 2014/0225622 A1 | 8/2014 | Kudo | 324/433 |
| 2014/0239964 A1 | 8/2014 | Gach | 324/433 |
| 2014/0260577 A1 | 9/2014 | Chinnadurai | |
| 2014/0266061 A1 | 9/2014 | Wachal | |
| 2014/0278159 A1 | 9/2014 | Chinnadurai | |
| 2014/0354237 A1 | 12/2014 | Cotton | |
| 2014/0368156 A1* | 12/2014 | Aloe | H02J 7/0013 |
| | | | 320/106 |
| 2014/0374475 A1 | 12/2014 | Kallfelz et al. | |
| 2015/0093922 A1 | 4/2015 | Bosscher | 439/39 |
| 2015/0115720 A1 | 4/2015 | Hysell | 307/65 |
| 2015/0166518 A1 | 6/2015 | Boral et al. | |
| 2015/0168499 A1 | 6/2015 | Palmisano | |
| 2015/0221135 A1 | 8/2015 | Hill | 345/633 |
| 2015/0239365 A1 | 8/2015 | Hyde et al. | |
| 2016/0011271 A1 | 1/2016 | Bertness | |
| 2016/0091571 A1 | 3/2016 | Salo, III | |
| 2016/0154044 A1 | 6/2016 | Bertness | |
| 2016/0171799 A1 | 6/2016 | Bertness | |
| 2016/0216335 A1 | 7/2016 | Bertness | |
| 2016/0232736 A1 | 8/2016 | Holtappels | |
| 2016/0238667 A1 | 8/2016 | Palmisano et al. | |
| 2016/0253852 A1 | 9/2016 | Bertness et al. | |
| 2016/0266212 A1 | 9/2016 | Carlo | |
| 2016/0285284 A1 | 9/2016 | Matlapudi et al. | |
| 2016/0321897 A1 | 11/2016 | Lee | |
| 2016/0336623 A1 | 11/2016 | Nayar | |
| 2017/0093056 A1 | 3/2017 | Salo, III et al. | |
| 2017/0146602 A1 | 5/2017 | Samp | |
| 2017/0158058 A1 | 6/2017 | Lee et al. | |
| 2017/0373410 A1 | 12/2017 | Lipkin et al. | |
| 2018/0009328 A1 | 1/2018 | Hinterberger et al. | |
| 2018/0113171 A1 | 4/2018 | Bertness | |
| 2018/0306867 A1 | 10/2018 | Bertness | |
| 2019/0105998 A1 | 4/2019 | Bertness | |
| 2019/0152332 A1 | 5/2019 | Bertness | |
| 2019/0154763 A1 | 5/2019 | Bertness | |
| 2019/0204392 A1 | 7/2019 | Bertness | |
| 2020/0086757 A1* | 3/2020 | Väin | B60L 53/80 |
| 2020/0174078 A1 | 6/2020 | Salo, III et al. | |
| 2021/0048374 A1 | 2/2021 | Sampson et al. | |
| 2021/0049480 A1 | 2/2021 | Kale et al. | |
| 2021/0135462 A1 | 5/2021 | Sampson et al. | |
| 2021/0141021 A1 | 5/2021 | Salo, III et al. | |
| 2021/0141043 A1 | 5/2021 | Bertness | |
| 2021/0203016 A1 | 7/2021 | Bertness | |
| 2021/0231737 A1 | 7/2021 | Salo, III et al. | |
| 2021/0325471 A1 | 10/2021 | Bertness | |

FOREIGN PATENT DOCUMENTS

| | | |
|---|---|---|
| CN | 103091633 | 5/2013 |
| CN | 206658084 | 11/2017 |
| DE | 29 26 716 B1 | 1/1981 |
| DE | 40 07 883 | 9/1991 |
| DE | 196 38 324 | 9/1996 |
| DE | 601 12 502 T2 | 6/2006 |
| DE | 10 2009 013 857 | 10/2009 |
| DE | 10 2008 036 595 A1 | 2/2010 |
| EP | 0 022 450 A1 | 1/1981 |
| EP | 0 391 694 A2 | 4/1990 |
| EP | 0 476 405 A1 | 9/1991 |
| EP | 0 637 754 A1 | 2/1995 |
| EP | 0 772 056 A1 | 5/1997 |
| EP | 0 982 159 A2 | 3/2000 |
| EP | 1 810 869 A1 | 11/2004 |
| EP | 1 786 057 | 5/2007 |
| EP | 1 807 710 B1 | 7/2007 |
| EP | 1 807 710 | 1/2010 |
| EP | 2 302 724 | 3/2011 |
| FR | 2 749 397 | 12/1997 |
| GB | 154 016 | 11/1920 |
| GB | 2 029 586 | 3/1980 |
| GB | 2 088 159 A | 6/1982 |
| GB | 2 246 916 A | 10/1990 |
| GB | 2 266 150 | 10/1993 |
| GB | 2 275 783 A | 7/1994 |
| GB | 2 353 367 | 2/2001 |
| GB | 2 387 235 A | 10/2003 |
| JP | 59-17892 | 1/1984 |
| JP | 59-17893 | 1/1984 |
| JP | 59017894 | 1/1984 |
| JP | 59215674 | 12/1984 |
| JP | 60225078 | 11/1985 |
| JP | 62-180284 | 8/1987 |
| JP | 63027776 | 2/1988 |
| JP | 03274479 | 12/1991 |
| JP | 03282276 | 12/1991 |
| JP | 4-8636 | 1/1992 |
| JP | 04095788 | 3/1992 |
| JP | 04131779 | 5/1992 |
| JP | 04372536 | 12/1992 |
| JP | 05211724 A | 8/1993 |
| JP | 5216550 | 8/1993 |
| JP | 7-128414 | 5/1995 |
| JP | 09061505 | 3/1997 |
| JP | 10056744 | 2/1998 |
| JP | 10232273 | 9/1998 |
| JP | 11103503 A | 4/1999 |
| JP | 11-150809 | 6/1999 |
| JP | 11-271409 | 10/1999 |
| JP | 2001-023037 | 1/2001 |
| JP | 2001057711 A | 2/2001 |
| JP | 2003-346909 | 12/2003 |
| JP | 2005-238969 | 9/2005 |
| JP | 2006-242674 | 9/2006 |
| JP | 2006331976 A | 12/2006 |
| JP | 2009-244166 | 10/2009 |
| JP | 2009-261174 | 11/2009 |
| JP | 2010-172122 | 5/2010 |
| JP | 2010-172142 | 8/2010 |
| RU | 2089015 C1 | 8/1997 |
| WO | WO 93/22666 | 11/1993 |
| WO | WO 94/05069 | 3/1994 |
| WO | WO 96/01456 | 1/1996 |
| WO | WO 96/06747 | 3/1996 |
| WO | WO 96/28846 | 9/1996 |
| WO | WO 97/01103 | 1/1997 |
| WO | WO 97/44652 | 11/1997 |
| WO | WO 98/04910 | 2/1998 |
| WO | WO 98/21132 | 5/1998 |
| WO | WO 98/58270 | 12/1998 |
| WO | WO 99/23738 | 5/1999 |
| WO | WO 99/56121 | 11/1999 |
| WO | WO 00/16083 | 3/2000 |
| WO | WO 00/62049 | 10/2000 |
| WO | WO 00/67359 | 11/2000 |
| WO | WO 01/59443 | 2/2001 |
| WO | WO 01/16614 | 3/2001 |
| WO | WO 01/16615 | 3/2001 |
| WO | WO 01/51947 | 7/2001 |
| WO | WO 03/047064 A3 | 6/2003 |
| WO | WO 03/076960 A1 | 9/2003 |
| WO | WO 2004/047215 A1 | 6/2004 |
| WO | WO 2007/075403 | 7/2007 |
| WO | WO 2009/004001 | 1/2009 |
| WO | WO 2010/007681 | 1/2010 |
| WO | WO 2010/035605 | 4/2010 |
| WO | WO 2010/042517 | 4/2010 |
| WO | WO 2011/153419 | 12/2011 |
| WO | WO 2012/078921 | 6/2012 |
| WO | WO 2013/070850 | 5/2013 |

OTHER PUBLICATIONS

"Battery Impedance", by E. Willihnganz et al., *Electrical Engineering*, Sep. 1959, pp. 922-925.

"Determining The End of Battery Life", by S. DeBardelaben, *IEEE*, 1986, pp. 365-368.

(56) References Cited

OTHER PUBLICATIONS

"A Look at the Impedance of a Cell", by S. Debardelaben, *IEEE*, 1988, pp. 394-397.
"The Impedance of Electrical Storage Cells", by N. A. Hampson et al., *Journal of Applied Electrochemistry*, 1980, pp. 3-11.
"A Package for Impedance/Admittance Data Analysis", by B. Boukamp, *Solid State Ionics*, 1986, pp. 136-140.
"Precision of Impedance Spectroscopy Estimates of Bulk, Reaction Rate, and Diffusion Parameters", by J. Macdonald et al., *J. Electroanal, Chem.*, 1991, pp. 1-11.
Internal Resistance: Harbinger of Capacity Loss in Starved Electrolyte Sealed Lead Acid Batteries, by Vaccaro, F.J. et al., *AT&T Bell Laboratories*, 1987 IEEE, Ch. 2477, pp. 128,131.
IEEE Recommended Practice for Maintenance, Testings, and Replacement of Large Lead Storage Batteries for Generating Stations and Substations, *The Institute of Electrical and Electronics Engineers, Inc., ANSI/IEEE Std.* 450-1987, Mar. 9, 1987, pp. 7-15.
"Field and Laboratory Studies to Assess the State of Health of Valve-Regulated Lead Acid Batteries: Part I Conductance/Capacity Correlation Studies", by D. Feder et al., *IEEE*, Aug. 1992, pp. 218-233.
"JIS Japanese Industrial Standard-Lead Acid Batteries for Automobiles", *Japanese Standards Association UDC*, 621.355.2:629.113.006, Nov. 1995.
"Performance of Dry Cells", by C. Hambuechen, Preprint of *Am. Electrochem. Soc.*, Apr. 18-20, 1912, paper No. 19, pp. 1-5.
"A Bridge for Measuring Storage Battery Resistance", by E. Wilihncanz, *The Electrochemical Society*, preprint 79-20, Apr. 1941, pp. 253-258.
National Semiconductor Corporation, "High Q Notch Filter", Mar. 1969, Linear Brief 5, Mar. 1969.
Burr-Brown Corporation, "Design a 60 Hz Notch Filter with the UAF42", Jan. 1994, AB-071, 1994.
National Semiconductor Corporation, "LMF90-4$^{th}$-Order Elliptic Notch Filter", Dec. 1994, RRD-B30M115, Dec. 1994.
"Alligator Clips with Wire Penetrators" *J.S. Popper, Inc.* product information, download from http://www.jspopper.com/, prior to Oct. 1, 2002.
"#12: LM78S40 Simple Switcher DC to DC Converter", *ITM e-Catalog*, downloaded from http://www.pcbcafe.com, prior to Oct. 1, 2002.
"Simple DC-DC Converts Allows Use of Single Battery", *Electronix Express*, downloaded from http://www.elexp.com/t_dc-dc.htm, prior to Oct. 1, 2002.
"DC-DC Converter Basics", *Power Designers*, downloaded from http://www.powerdesigners.com/InforWeb.design_center/articles/DC-DC/converter.shtm, prior to Oct. 1, 2002.
"Notification of Transmittal of The International Search Report or the Declaration", PCT/US02/29461, filed Sep. 17, 2002 and dated Jan. 3, 2003.
"Notification of Transmittal of The International Search Report or the Declaration", PCT/US03/07546, filed Mar. 13, 2003 and dated Jul. 4, 2001.
"Notification of Transmittal of The International Search Report or the Declaration", PCT/US03/06577, filed Mar. 5, 2003 and dated Jul. 24, 2003.
"Notification of Transmittal of The International Search Report or the Declaration", PCT/US03/07837, filed Mar. 14, 2003 and dated Jul. 4, 2003.
"Improved Impedance Spectroscopy Technique for Status Determination of Production Li/SO$_2$ Batteries" Terrill Atwater et al., pp. 10-113, (1992).
"Notification of Transmittal of The International Search Report or the Declaration", PCT/US03/41561; Search Report completed Apr. 13, 2004, dated May 6, 2004.
"Notification of Transmittal of The International Search Report or the Declaration", PCT/US03/27696, filed Sep. 4, 2003 and dated Apr. 15, 2004.

"Programming Training Course, 62-000 Series Smart Engine Analyzer", Testproducts Division, Kalamazoo, Michigan, pp. 1-207, (1984).
"Operators Manual, Modular Computer Analyzer Model MCA 3000", Sun Electric Corporation, Crystal Lake, Illinois, pp. 1-1-14-13, (1991).
Supplementary European Search Report Communication for Appl. No. 99917402.2; dated Sep. 7, 2004.
"Dynamic modelling of lead/acid batteries using impedance spectroscopy for parameter identification", Journal of Power Sources, pp. 69-84, (1997).
Notification of Transmittal of the International Search Report for PCT/US03/30707, filed Sep. 30, 2003 and dated Nov. 24, 2004.
"A review of impedance measurements for determination of the state-of-charge or state-of-health of secondary batteries", Journal of Power Sources, pp. 59-69, (1998).
"Search Report Under Section 17" for Great Britain Application No. GB0421447.4, date of search Jan. 27, 2005, date of document Jan. 28, 2005.
"Results of Discrete Frequency Immittance Spectroscopy (DFIS) Measurements of Lead Acid Batteries", by K.S. Champlin et al., *Proceedings of 23$^{rd}$ International Teleco Conference (INTELEC)*, published Oct. 2001, IEE, pp. 433-440.
"Examination Report" from the UK Patent Office for App. No. 0417678.0; dated Jan. 24, 2005.
Wikipedia Online Encyclopedia, Inductance, 2005, http://en.wikipedia.org/wiki/inductance, pp. 1-5, mutual Inductance, pp. 3,4.
"Professional BCS System Analyzer Battery-Charger-Starting", pp. 2-8, (2001).
Young Illustrated Encyclopedia Dictionary of Electronics, 1981, Parker Publishing Company, Inc., pp. 318-319.
"DSP Applications in Hybrid Electric Vehicle Powertrain", Miller et al., Proceedings of the American Control Conference, San Diego, CA, Jun. 1999; 2 ppg.
"Notification of Transmittal of the International Search Report and the Written Opinion of the International Searching Authority, or the Declaration" for PCT/US2008/008702 filed Jul. 2008; 15 pages.
"A Microprocessor-Based Control System for a Near-Term Electric Vehicle", Bimal K. Bose; IEEE Transactions on Industry Applications, vol. IA-17, No. 6, Nov./Dec. 1981; 0093-9994/81/1100-0626$00.75 © 1981 IEEE, 6 pages.
Notification of Transmittal of the International Search Report and the Written Opinion of the International Searching Authority, or the Declaration for PCT/US2011/038279 filed May 27, 2011, dated Sep. 16, 2011, 12 pages.
U.S. Appl. No. 60/387,912, filed Jun. 13, 2002 which is related to U.S. Pat. No. 7,089,127.
"Conductance Testing Compared to Traditional Methods of Evaluating the Capacity of Valve-Regulated Lead-Acid Batteries and Predicting State-of-Health", by D. Feder et al., May 1992, pp. 1-8; (13 total pgs.).
"Field and Laboratory Studies to Assess the State of Health of Valve-Regulated Lead Acid Batteries: Part I—Conductance/Capacity Correlation Studies", by D. Feder at al., Oct. 1992, pp. 1-15; (19 total pgs.).
"Field Application of Conductance Measurements Use to Ascertain Cell/Battery and Inter-Cell Connection State-of-Health in Electric Power Utility Applications", by M. Hlavac et al., Apr. 1993, pp. 1-14; (19 total pgs.).
"Conductance Testing of Standby Batteries in Signaling and Communications Applications for the Purpose of Evaluating Battery State-of-Health", by S. McShane, Apr. 1993, pp. 1-9; (14 total pgs.).
"Condutance Monitoring of Recombination Lead Acid Batteries", by B. Jones, May 1993, pp. 1-6; (11 total pgs.).
"Evaluating the State-of-Health of Lead Acid Flooded and Valve-Regulated Batteries: a Comparison of Conductance Testing vs. Traditional Methods", by M. Hlavac et al., Jun. 1993, pp. 1-15; (20 total pgs.).
"Updated State of Conductance/Capacity Correlation Studies to Determine the State-of-Health of Automotive SLI and Standby Lead Acid Batteries", by D. Feder et al., Sep. 1993, pp. 1-17; (22 total pgs.).

(56) References Cited

OTHER PUBLICATIONS

"Field and Laboratory Studies to Access the State-of-Health of Valve-Regulated Lead-Acid Battery Technologies Using Conductance Testing Part II—Further Conductance/Capacity Correlation Studies", by M. Hlavac et al., Sep. 1993, pp. 1-9; (14 total pgs.).
"Field Experience of Testing VRLA Batteries by Measuring Conductance", by M.W. Kniveton, May 1994, pp. 1-4; (9 total pgs.).
"Reducing the Cost of Maintaining VRLA Batteries in Telecom Applications", by M.W. Kniveton, Sep. 1994, pp. 1-5; (10 total pgs.).
"Analysis and Interpretation of Conductance Measurements used to Access the State-of-Health of Valve Regulated Lead Acid Batteries Part III: Analytical Techniques", by M. Hlavac, Nov. 1994, 9 pgs; (13 total pgs.).
"Testing 24 Volt Aircraft Batteries Using Midtronics Conductance Technology", by M. Hlavac et al., Jan. 1995, 9 pgs; (13 total pgs.).
"VRLA Battery Monitoring Using Conductance Technology Part IV: On-Line State-of-Health Monitoring and Thermal Runaway Detection/Prevention", by M. Hlavac et al., Oct. 1995, 9 pgs; (13 total pgs.).
"VRLA Battery Conductance Monitoring Part V: Strategies for VRLA Battery Testing and Monitoring in Telecom Operating Environments", by M. Hlavac et al., Oct. 1996, 9 pgs; (13 total pgs.).
"Midpoint Conductance Technology Used in Telecommunication Stationary Standby Battery Applications Part VI: Considerations for Deployment of Midpoint Conductance in Telecommunications Power Applications", by M. Troy et al., Oct. 1997, 9 pgs; (13 total pgs.).
"Impedance/Conductance Measurements as an Aid to Determining Replacement Strategies", M. Kniveton, Sep. 1998, pp. 297-301; (9 total pgs.).
"A Fundamentally New Approach to Battery Performance Analysis Using DFRA™/DTIS™ Technology", by K. Champlin et al., Sep. 2000, 8 pgs; (12 total pgs.).
"Battery State of Health Monitoring, Combining Conductance Technology With Other Measurement Parameters for Real-Time Battery Performance Analysis", by D. Cox et al., Mar. 2000, 6 pgs; (10 total pgs.).
Search Report and Written Opinion from PCT Application No. PCT/US2011/026608, dated Aug. 29, 2011, 9 pgs.
Examination Report under section 18(3) for corresponding Great Britain Application No. GB1000773.0, dated Feb. 6, 2012, 2 pages.
Communication from GB1216105.5, dated Sep. 21, 2012.
Notification of Transmittal of the International Search Report and Written Opinion from PCT/US2011/039043, dated Jul. 26, 2012.
Notification of Transmittal of the International Search Report and Written Opinion from PCT/US2011/053886, dated Jul. 27, 2012.
"Field Evaluation of Honda's EV PLUS Battery Packs", by A. Paryani, *IEEE AES Systems Magazine*, Nov. 2000, pp. 21-24.
Search Report from PCT/US2011/047354, dated Nov. 11, 2011.
Written Opinion from PCT/US2011/047354, dated Nov. 11, 2011.
First Office Action (Notification of Reasons for Rejections) dated Dec. 3, 2013 in related Japanese patent application No. 2013-513370, 9 pgs. Including English Translation.
Official Action dated Jan. 22, 2014 in Korean patent application No. 10-2012-7033020, 2 pgs including English Translation.
Official Action dated Feb. 20, 2014 in Korean patent application No. 10-2013-7004814, 6 pgs including English Translation.
First Office Action for Chinese Patent Application No. 201180011597.4, dated May 6, 2014, 20 pages.
Office Action from Korean Application No. 10/2012-7033020, dated Jul. 29, 2014.
Office Action for Chinese Patent Application No. 201180038844.X, dated Jul. 1, 2014.
Office Action for Chinese Patent Application No. 201180030045.8, dated Jul. 21, 2014.
Office Action for German Patent Application No. 1120111020643 dated Aug. 28, 2014.
Office Action from Japanese Patent Application No. 2013-513370, dated Aug. 5, 2014.
Office Action from Japanese Patent Application No. 2013-531839, dated Jul. 8, 2014.
Office Action for German Patent Application No. 103 32 625.1, dated Nov. 7, 2014, 14 pages.
Office Action from Chinese Patent Application No. 201180038844.X, dated Dec. 8, 2014.
Office Action from CN Application No. 201180011597.4, dated Jan. 6, 2015.
Office Action for Chinese Patent Application No. 201180030045.8, dated Mar. 24, 2015.
Office Action for Japanese Patent Application No. 2013-531839, dated Mar. 31, 2015.
Notification of Transmittal of the International Search Report and Written Opinion from PCT/US2014/069661, dated Mar. 26, 2015.
Office Action for Chinese Patent Application No. 201180038844.X, dated Jun. 8, 2015.
Office Action from Chinese Patent Application No. 201180011597.4 dated Jun. 3, 2015.
European Search Report from European Application No. EP 15151426.2, dated Jun. 1, 2015.
Notification of Transmittal of the International Search Report and the Written Opinion from PCT/US2016/014867, dated Jun. 3, 2016.
Office Action from Japanese Patent Application No. 2015-014002, dated Jul. 19, 2016.
Notification of Transmittal of the International Search Report and the Written Opinion of the International Searching Authority from PCT/US2016/029696, dated Aug. 24, 2016.
Office Action from German Patent Application No. 10393251.8, dated Nov. 4, 2016, including English translation.
Office Action from European Patent Application No. 15 151 426.2-1801, dated Aug. 28, 2017, 2 pages.
Office Action from Japanese Patent Application No. 2017-026740, dated Jan. 9, 2018.
Office Action from German Patent Application No. 112011101892.4, dated Sep. 7, 2017.
Office Action from Chinese Patent Application No. 201480066251.8, dated May 29, 2018.
Brochure: "Sensors Intelligent Battery Sensors, Measuring Battery Capacity and Ageing", by Hella, 6 pgs.
Office Action from Japanese Patent Application No. 2017-026740, dated May 8, 2018.
U.S. Appl. No. 12/697,485, filed Feb. 1, 2010, 36 pgs.
Office Action from Chinese Patent Application No. 201480066251.8, dated Dec. 13, 2018.
Notification of Transmittal of the International Search Report and the Written Opinion of the International Searching Authority, or the Declaration for PCT/US2019/014487, dated Apr. 11, 2019.
Notification of Transmittal of the International Search Report and the Written Opinion of the International Searching Authority, or the Declaration for PCT/US2019/014494, dated Apr. 24, 2019.
U.S. Appl. No. 16/943,120, filed Jul. 30, 2020. (should publish Jan. 30, 2021).
U.S. Appl. No. 17/088,824, filed Nov. 4, 2020. (should publish May 5, 2021).
U.S. Appl. No. 17/086,629, filed Nov. 2, 2020. (should publish May 11, 2021).
U.S. Appl. No. 17/090,129, filed Nov. 5, 2020. (should publish May 12, 2021).
Office Action from German Patent Application No. 11 2011 101 892.4, dated Oct. 1, 2020, and translation using Google Translate.
Wikipedia Online Encyclopedia, https: // de.wikipedia.org/w/index.php?title= four-wire measurement & oldid=67143514-4 (Retrieved Sep. 15, 2020) along with Google Translation.
Notification of Transmittal of the International Search Report and the Written Opinion of the International Searching Authority, or the Declaration for PCT/US2020/059015, dated Jan. 22, 2021.
U.S. Appl. No. 17/504,897, filed Oct. 19, 2021.
Notification of Transmittal of the International Search Report and the Written Opinion of the International Searching Authority, or the Declaration for PCT/US2021/040313 dated Oct. 25, 2021; 14 pages.

* cited by examiner

| Battery ID | Parameter 1 | Parameter 2 | | Parameter M |
|---|---|---|---|---|
| $ID_1$ | $P_{11}$ | $P_{21}$ | | $P_{M1}$ |
| $ID_2$ | $P_{12}$ | $P_{22}$ | | $P_{M2}$ |
| $ID_N$ | $P_{1N}$ | $P_{2N}$ | | $P_{MN}$ |

BATTERY PACK MAINTENANCE SYSTEM

CROSS-REFERENCE TO RELATED APPLICATION

The present application is based on and claims the benefit of U.S. provisional patent application Ser. No. 62/934,122, filed Nov. 12, 2019, the content of which is hereby incorporated by reference in its entirety.

FIELD

The present disclosure relates to battery packs for storing electricity, and more specifically, to systems and methods for performing battery pack maintenance.

BACKGROUND

Storage batteries, such as lead acid storage batteries of the type used in the automotive industry, have existed for many years. Storage batteries consist of a plurality of individual storage cells electrically connected in series. Typically, each cell has a voltage potential of about 2.1 volts. By connecting the cells in series, the voltage of the individual cells is added in a cumulative manner. For example, in a typical automotive storage battery, six storage cells are used to provide a total voltage when the battery is fully charged up to 12.6 volts.

Battery packs may be used to handle larger power demands. Such packs have many applications including power supplies, such as for heavy duty or semi-trailer trucks, temporary power generating equipment, electrical vehicles including both hybrid and purely electric vehicles, and other applications.

The batteries used to form such battery packs may each be formed of a number of individual storage cells, or may each be individual storage cells depending on the configuration of the battery and battery pack. The various individual storage cell batteries or multiple storage cell batteries forming the battery pack may be joined together in series and/or in parallel to provide the desired output.

In order to avoid the large expense of replacing an entire battery pack, it is necessary to perform regular testing and maintenance on the battery pack, and replace failing batteries, storage cells, and battery components. While testing techniques for individual batteries and storage cells have been developed, battery packs present unique issues that make testing of the battery packs substantially more complicated.

For example, when testing a battery within the battery pack, it is often necessary to disconnect the battery from the battery pack in order to obtain accurate test results. This is time consuming and requires a significant amount of "down time" during which the battery is disconnected, tested and then reconnected.

SUMMARY

Embodiments of the present disclosure relate to a battery pack maintenance system configured to perform maintenance operations on batteries, such as batteries of a battery pack, for example, and methods performed by the battery pack maintenance system. One embodiment of the system includes maintenance circuitry, image input circuitry, a display, and user input circuitry. The maintenance circuitry is configured to perform a maintenance operation on a battery pack having a plurality of batteries. The image input circuitry is configured to receive an image of the battery pack. The display is configured to display the image. The user input circuitry is configured to receive a battery selection user input identifying a selected battery of the battery pack. The maintenance circuitry is configured to associate the battery selection user input with a maintenance operation performed on the selected battery.

In the method performed by a battery pack maintenance system, an image of a battery pack having a plurality of batteries is received using image input circuitry of the system. The image is displayed on a display of the system. A battery selection user input identifying a selected battery of the battery pack is received using user input circuitry of the system. The battery selection user input is associated with a maintenance operation performed on the selected battery using maintenance circuitry of the system.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter. The claimed subject matter is not limited to implementations that solve any or all disadvantages noted in the Background.

DETAILED DESCRIPTION OF ILLUSTRATIVE EMBODIMENTS

Figure 1:
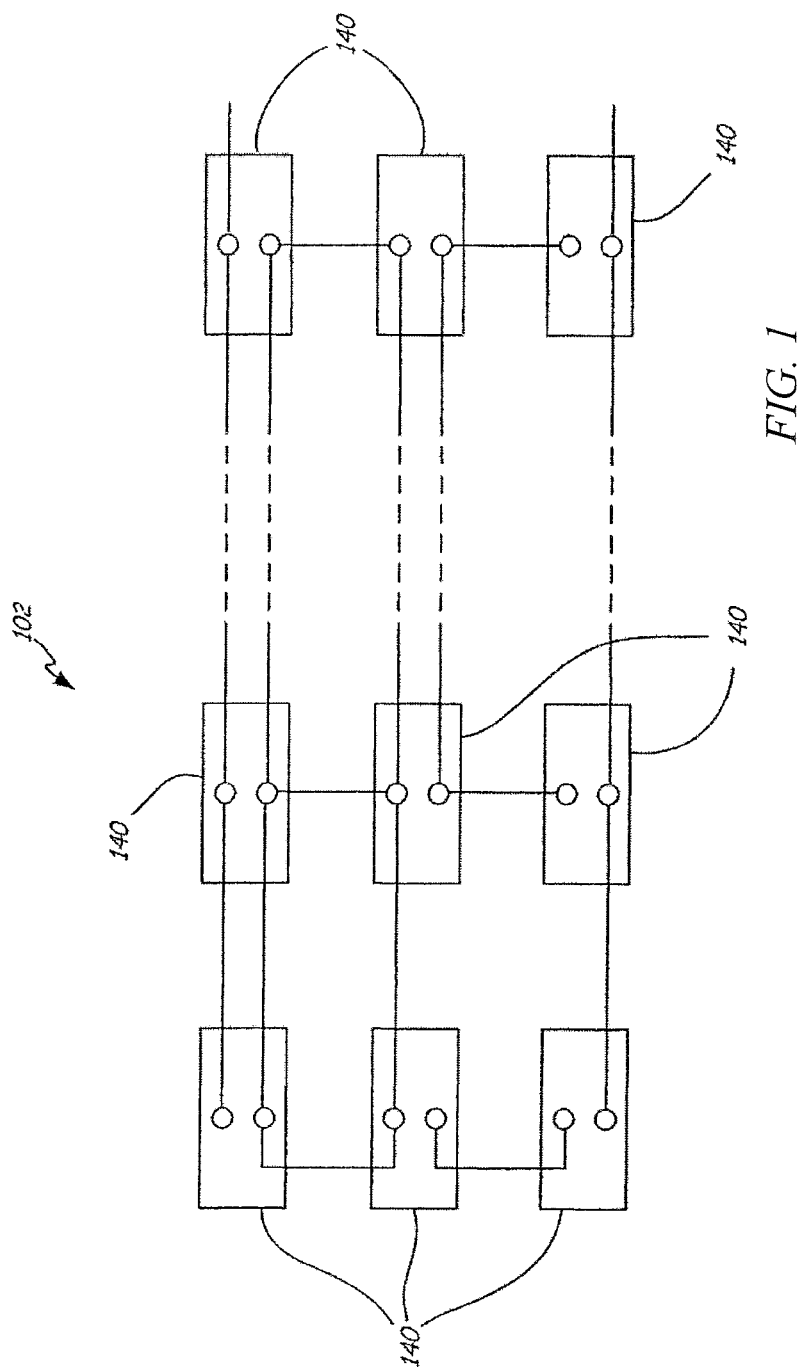
FIG. 1 is simplified schematic diagram of an example of a battery pack, in accordance with embodiments of the present disclosure.

Embodiments of the present disclosure are described more fully hereinafter with reference to the accompanying drawings. Elements that are identified using the same or similar reference characters refer to the same or similar elements. The various embodiments of the present disclosure may, however, be embodied in many different forms and should not be construed as limited to the embodiments set forth herein. Rather, these embodiments are provided so that this disclosure will be thorough and complete, and will fully convey the scope of the present disclosure to those skilled in the art.

Computer program or software aspects of embodiments of the present disclosure may comprise computer readable instructions or code stored in a computer readable medium or memory. Execution of the program instructions by one or more processors (e.g., central processing unit, controller, microprocessor, etc.) results in the one or more processors performing one or more functions or method steps described herein. Any suitable patent subject matter eligible computer readable media or memory may be utilized including, for example, hard disks, CD-ROMs, optical storage devices, or magnetic storage devices. Such computer readable media or memory do not include transitory waves or signals.

FIG. 1 is a simplified diagram of an example configuration of battery pack 102 in which a plurality of individual batteries 140 (e.g., lead acid storage batteries) may be connected in series and/or in parallel. The battery pack 102 may be configured for vehicle starting, lighting and ignition operations of non-electric vehicles, for example. Each of the individual batteries 140 may comprise a single cell or may comprise multiple cells connected in series and/or parallel. These may be removable battery modules formed by a single cell or a group of cells. If elements 140 are a group of cells, in some configurations individual connections may be available within the battery and used in accordance with embodiments of the present disclosure. The battery 140 and/or cells may operate in accordance with any suitable battery technology.

The battery pack 102 will degrade with time and use. This degradation may be gradual, or may occur rapidly based upon a failure of a component within the pack 102. When such a failure occurs, or when the pack has degraded sufficiently, the entire battery pack 102 is typically replaced, which can be very expensive. Some embodiments of the present disclosure are directed to performing maintenance on battery pack 102. Such maintenance can be performed after the battery pack has failed, or prior to the failure of the battery pack.

The failure, degradation, or impending failure of the battery pack 102 may be due to one or more of the individual batteries 140 within the pack failing or degrading. In such a case, the battery pack 102 can be refurbished or otherwise repaired by identifying the failed, failing, or degraded batteries 140 and replacing them with operable batteries 140.

However, the simple replacement of a faulty battery 140 in a battery pack 102 may not provide the optimum configuration for the repaired or refurbished battery pack 102. More specifically, a "new" battery 140 used to replace a "bad" battery 140 within the battery pack 102 will introduce a battery which is not balanced with respect to other batteries 140 in the pack 102. This unbalanced battery 140 may cause further deterioration in the battery pack 102. Thus, in some embodiments, batteries 140 which have a similar characteristic or measured parameter are selected for replacing bad batteries 140 within a battery pack 102.

Embodiments of the present disclosure include methods and apparatuses in which batteries 140 for use in battery packs 102 are sorted and selected for replacement based upon measured parameters. The measured parameters can be selected such that they are in agreement with one another within a desired range. Example parameters include static parameters in which a static property of a battery is measured using a static function as well as dynamic parameters in which a property of a battery is measured using a dynamic function. Example parameters include dynamic parameters such as conductance resistance, admittance, impedance, etc., as well as static equivalents. Load testing based parameters may also be employed. Other example parameters include battery capacitance, battery state of charge, battery voltage, and others.

Figure 2:
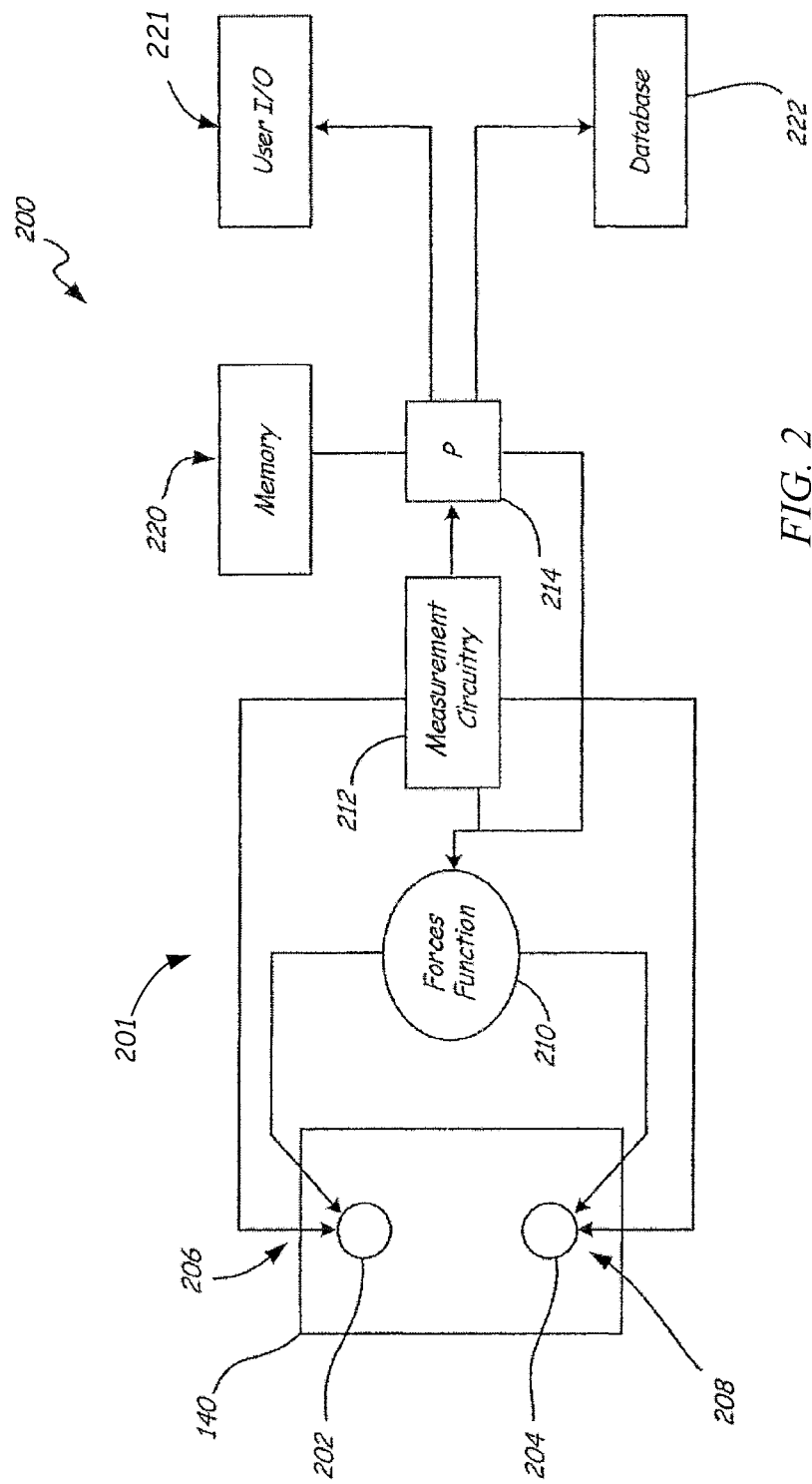
FIG. 2 is a block diagram of an example of a device for use in refurbishing a battery pack, in accordance with embodiments of the present disclosure.

FIG. 2 is a simplified block diagram of a battery pack maintenance device 200 including an example of maintenance circuitry 201 for performing maintenance operations (e.g., testing, charging, etc.) on battery pack 102. The maintenance device 200 is shown coupled to a battery 140 having a positive terminal 202 and a negative terminal 204. A Kelvin connection 206 is provided to terminal 202 and a similar Kelvin connector 208 is provided to the terminal 204. Through Kelvin connections 206 and 208, a forcing function 210 is coupled to the battery 140.

During an example of a testing operation, the forcing function 210 applies a forcing function signal to the battery 140. The forcing function signal may have a time varying component and may be an active signal, in which an electrical signal is injected into the battery 140, or the forcing function signal may be a passive signal, in which a current is drawn from the battery 140.

Measurement circuitry 212 is configured to measure a response of the battery 140 to the applied forcing function signal from the forcing function 210. The measurement circuitry 212 provides a measurement signal to a microprocessor 214. The microprocessor 214 performs functions in response to the execution of instructions stored in the memory 220. The memory 220 may also be configured to contain information relating to the battery 140, such as parameters measured from the battery 140 during a testing operation, and/or other information. Further, the device 200 may be configured to store data in a database 222. The maintenance circuitry may include input/output circuitry 221 for use by an operator of the device 200.

Battery testing operations performed by the device 200 and the maintenance circuitry 201 may be performed in accordance with techniques pioneered by Midtronics, Inc. of Willowbrook, Ill., and Dr. Keith S. Champlin, including for example, one or more techniques described in U.S. Pat. No. 3,873,911, issued Mar. 25, 1975, to Champlin; U.S. Pat. No. 3,909,708, issued Sep. 30, 1975, to Champlin; U.S. Pat. No. 4,816,768, issued Mar. 28, 1989, to Champlin; U.S. Pat. No. 4,825,170, issued Apr. 25, 1989, to Champlin; U.S. Pat. No. 4,881,038, issued Nov. 14, 1989, to Champlin; U.S. Pat. No. 4,912,416, issued Mar. 27, 1990, to Champlin; U.S. Pat. No. 5,140,269, issued Aug. 18, 1992, to Champlin; U.S. Pat. No. 5,343,380, issued Aug. 30, 1994; U.S. Pat. No. 5,572,136, issued Nov. 5, 1996; U.S. Pat. No. 5,574,355, issued Nov. 12, 1996; U.S. Pat. No. 5,583,416, issued Dec. 10, 1996; U.S. Pat. No. 5,585,728, issued Dec. 17, 1996; U.S. Pat. No. 5,589,757, issued Dec. 31, 1996; U.S. Pat. No. 5,592,093, issued Jan. 7, 1997; U.S. Pat. No. 5,598,098, issued Jan. 28, 1997; U.S. Pat. No. 5,656,920, issued Aug. 12, 1997; U.S. Pat. No. 5,757,192, issued May 26, 1998; U.S. Pat. No. 5,821,756, issued Oct. 13, 1998; U.S. Pat. No. 5,831,435, issued Nov. 3, 1998; U.S. Pat. No. 5,871,858, issued Feb. 16, 1999; U.S. Pat. No. 5,914,605, issued Jun. 22, 1999; U.S. Pat. No. 5,945,829, issued Aug. 31, 1999; U.S. Pat. No. 6,002,238, issued Dec. 14, 1999; U.S. Pat. No. 6,037,751, issued Mar. 14, 2000; U.S. Pat. No. 6,037,777, issued Mar. 14, 2000; U.S. Pat. No. 6,051,976, issued Apr. 18, 2000; U.S. Pat. No. 6,081,098, issued Jun. 27, 2000; U.S. Pat. No. 6,091,245, issued Jul. 18, 2000; U.S. Pat. No. 6,104,167, issued Aug. 15, 2000; U.S. Pat. No. 6,137,269, issued Oct. 24, 2000; U.S. Pat. No. 6,163,156, issued Dec. 19, 2000; U.S. Pat. No. 6,172,483, issued Jan. 9, 2001; U.S. Pat. No.

6,172,505, issued Jan. 9, 2001; U.S. Pat. No. 6,222,369, issued Apr. 24, 2001; U.S. Pat. No. 6,225,808, issued May 1, 2001; U.S. Pat. No. 6,249,124, issued Jun. 19, 2001; U.S. Pat. No. 6,259,254, issued Jul. 10, 2001; U.S. Pat. No. 6,262,563, issued Jul. 17, 2001; U.S. Pat. No. 6,294,896, issued Sep. 25, 2001; U.S. Pat. No. 6,294,897, issued Sep. 25, 2001; U.S. Pat. No. 6,304,087, issued Oct. 16, 2001; U.S. Pat. No. 6,310,481, issued Oct. 30, 2001; U.S. Pat. No. 6,313,607, issued Nov. 6, 2001; U.S. Pat. No. 6,313,608, issued Nov. 6, 2001; U.S. Pat. No. 6,316,914, issued Nov. 13, 2001; U.S. Pat. No. 6,323,650, issued Nov. 27, 2001; U.S. Pat. No. 6,329,793, issued Dec. 11, 2001; U.S. Pat. No. 6,331,762, issued Dec. 18, 2001; U.S. Pat. No. 6,332,113, issued Dec. 18, 2001; U.S. Pat. No. 6,351,102, issued Feb. 26, 2002; U.S. Pat. No. 6,359,441, issued Mar. 19, 2002; U.S. Pat. No. 6,363,303, issued Mar. 26, 2002; U.S. Pat. No. 6,377,031, issued Apr. 23, 2002; U.S. Pat. No. 6,392,414, issued May 21, 2002; U.S. Pat. No. 6,417,669, issued Jul. 9, 2002; U.S. Pat. No. 6,424,158, issued Jul. 23, 2002; U.S. Pat. No. 6,441,585, issued Aug. 17, 2002; U.S. Pat. No. 6,437,957, issued Aug. 20, 2002; U.S. Pat. No. 6,445,158, issued Sep. 3, 2002; U.S. Pat. Nos. 6,456,045; 6,466,025, issued Oct. 15, 2002; U.S. Pat. No. 6,465,908, issued Oct. 15, 2002; U.S. Pat. No. 6,466,026, issued Oct. 15, 2002; U.S. Pat. No. 6,469,511, issued Nov. 22, 2002; U.S. Pat. No. 6,495,990, issued Dec. 17, 2002; U.S. Pat. No. 6,497,209, issued Dec. 24, 2002; U.S. Pat. No. 6,507,196, issued Jan. 14, 2003; U.S. Pat. No. 6,534,993; issued Mar. 18, 2003; U.S. Pat. No. 6,544,078, issued Apr. 8, 2003; U.S. Pat. No. 6,556,019, issued Apr. 29, 2003; U.S. Pat. No. 6,566,883, issued May 20, 2003; U.S. Pat. No. 6,586,941, issued Jul. 1, 2003; U.S. Pat. No. 6,597,150, issued Jul. 22, 2003; U.S. Pat. No. 6,621,272, issued Sep. 16, 2003; U.S. Pat. No. 6,623,314, issued Sep. 23, 2003; U.S. Pat. No. 6,633,165, issued Oct. 14, 2003; U.S. Pat. No. 6,635,974, issued Oct. 21, 2003; U.S. Pat. No. 6,696,819, issued Feb. 24, 20144; U.S. Pat. No. 6,707,303, issued Mar. 16, 2004; U.S. Pat. No. 6,737,831, issued May 18, 2004; U.S. Pat. No. 6,744,149, issued Jun. 1, 2004; U.S. Pat. No. 6,759,849, issued Jul. 6, 2004; U.S. Pat. No. 6,781,382, issued Aug. 24, 2004; U.S. Pat. No. 6,788,025, filed Sep. 7, 2004; U.S. Pat. No. 6,795,782, issued Sep. 21, 2004; U.S. Pat. No. 6,805,090, filed Oct. 19, 2004; U.S. Pat. No. 6,806,716, filed Oct. 19, 2004; U.S. Pat. No. 6,850,037, filed Feb. 1, 2005; U.S. Pat. No. 6,850,037, issued Feb. 1, 2005; U.S. Pat. No. 6,871,151, issued Mar. 22, 2005; U.S. Pat. No. 6,885,195, issued Apr. 26, 2005; U.S. Pat. No. 6,888,468, issued May 3, 2005; U.S. Pat. No. 6,891,378, issued May 10, 2005; U.S. Pat. No. 6,906,522, issued Jun. 14, 2005; U.S. Pat. No. 6,906,523, issued Jun. 14, 2005; U.S. Pat. No. 6,909,287, issued Jun. 21, 2005; U.S. Pat. No. 6,914,413, issued Jul. 5, 2005; U.S. Pat. No. 6,913,483, issued Jul. 5, 2005; U.S. Pat. No. 6,930,485, issued Aug. 16, 2005; U.S. Pat. No. 6,933,727, issued Aug. 23, 200; U.S. Pat. No. 6,941,234, filed Sep. 6, 2005; U.S. Pat. No. 6,967,484, issued Nov. 22, 2005; U.S. Pat. No. 6,998,847, issued Feb. 14, 2006; U.S. Pat. No. 7,003,410, issued Feb. 21, 2006; U.S. Pat. No. 7,003,411, issued Feb. 21, 2006; U.S. Pat. No. 7,012,433, issued Mar. 14, 2006; U.S. Pat. No. 7,015,674, issued Mar. 21, 2006; U.S. Pat. No. 7,034,541, issued Apr. 25, 2006; U.S. Pat. No. 7,039,533, issued May 2, 2006; U.S. Pat. No. 7,058,525, issued Jun. 6, 2006; U.S. Pat. No. 7,081,755, issued Jul. 25, 2006; U.S. Pat. No. 7,106,070, issued Sep. 12, 2006; U.S. Pat. No. 7,116,109, issued Oct. 3, 2006; U.S. Pat. No. 7,119,686, issued Oct. 10, 2006; and U.S. Pat. No. 7,126,341, issued Oct. 24, 2006; U.S. Pat. No. 7,154,276, issued Dec. 26, 2006; U.S. Pat. No. 7,198,510, issued Apr. 3, 2007; U.S. Pat. No. 7,363,175, issued Apr. 22, 2008; U.S. Pat. No. 7,208,914, issued Apr. 24, 2007; U.S. Pat. No. 7,246,015, issued Jul. 17, 2007; U.S. Pat. No. 7,295,936, issued Nov. 13, 2007; U.S. Pat. No. 7,319,304, issued Jan. 15, 2008; U.S. Pat. No. 7,363,175, issued Apr. 22, 2008; U.S. Pat. No. 7,398,176, issued Jul. 8, 2008; U.S. Pat. No. 7,408,358, issued Aug. 5, 2008; U.S. Pat. No. 7,425,833, issued Sep. 16, 2008; U.S. Pat. No. 7,446,536, issued Nov. 4, 2008; U.S. Pat. No. 7,479,763, issued Jan. 20, 2009; U.S. Pat. No. 7,498,767, issued Mar. 3, 2009; U.S. Pat. No. 7,501,795, issued Mar. 10, 2009; U.S. Pat. No. 7,505,856, issued Mar. 17, 2009; U.S. Pat. No. 7,545,146, issued Jun. 9, 2009; U.S. Pat. No. 7,557,586, issued Jul. 7, 2009; U.S. Pat. No. 7,595,643, issued Sep. 29, 2009; U.S. Pat. No. 7,598,699, issued Oct. 6, 2009; U.S. Pat. No. 7,598,744, issued Oct. 6, 2009; U.S. Pat. No. 7,598,743, issued Oct. 6, 2009; U.S. Pat. No. 7,619,417, issued Nov. 17, 2009; U.S. Pat. No. 7,642,786, issued Jan. 5, 2010; U.S. Pat. No. 7,642,787, issued Jan. 5, 2010; U.S. Pat. No. 7,656,162, issued Feb. 2, 2010; U.S. Pat. No. 7,688,074, issued Mar. 30, 2010; U.S. Pat. No. 7,705,602, issued Apr. 27, 2010; U.S. Pat. No. 7,706,992, issued Apr. 27, 2010; U.S. Pat. No. 7,710,119, issued May 4, 2010; U.S. Pat. No. 7,723,993, issued May 25, 2010; U.S. Pat. No. 7,728,597, issued Jun. 1, 2010; U.S. Pat. No. 7,772,850, issued Aug. 10, 2010; U.S. Pat. No. 7,774,151, issued Aug. 10, 2010; U.S. Pat. No. 7,777,612, issued Aug. 17, 2010; U.S. Pat. No. 7,791,348, issued Sep. 7, 2010; U.S. Pat. No. 7,808,375, issued Oct. 5, 2010; U.S. Pat. No. 7,924,015, issued Apr. 12, 2011; U.S. Pat. No. 7,940,053, issued May 10, 2011; U.S. Pat. No. 7,940,052, issued May 10, 2011; U.S. Pat. No. 7,959,476, issued Jun. 14, 2011; U.S. Pat. No. 7,977,914, issued Jul. 12, 2011; U.S. Pat. No. 7,999,505, issued Aug. 16, 2011; U.S. Pat. No. D643,759, issued Aug. 23, 2011; U.S. Pat. No. 8,164,343, issued Apr. 24, 2012; U.S. Pat. No. 8,198,900, issued Jun. 12, 2012; U.S. Pat. No. 8,203,345, issued Jun. 19, 2012; U.S. Pat. No. 8,237,448, issued Aug. 7, 2012; U.S. Pat. No. 8,306,690, issued Nov. 6, 2012; U.S. Pat. No. 8,344,685, issued Jan. 1, 2013; U.S. Pat. No. 8,436,619, issued May 7, 2013; U.S. Pat. No. 8,442,877, issued May 14, 2013; U.S. Pat. No. 8,493,022, issued Jul. 23, 2013; U.S. Pat. No. D687,727, issued Aug. 13, 2013; U.S. Pat. No. 8,513,949, issued Aug. 20, 2013; U.S. Pat. No. 8,674,654, issued Mar. 18, 2014; U.S. Pat. No. 8,674,711, issued Mar. 18, 2014; U.S. Pat. No. 8,704,483, issued Apr. 22, 2014; U.S. Pat. No. 8,738,309, issued May 27, 2014; U.S. Pat. No. 8,754,653, issued Jun. 17, 2014; U.S. Pat. No. 8,872,516, issued Oct. 28, 2014; U.S. Pat. No. 8,872,517, issued Oct. 28, 2014; U.S. Pat. No. 8,958,998, issued Feb. 17, 2015; U.S. Pat. No. 8,963,550, issued Feb. 24, 2015; U.S. Pat. No. 9,018,958, issued Apr. 28, 2015; U.S. Pat. No. 9,052,366, issued Jun. 9, 2015; U.S. Pat. No. 9,201,120, issued Dec. 1, 2015; U.S. Pat. No. 9,229,062, issued Jan. 5, 20126; U.S. Pat. No. 9,244,100, issued Jan. 26, 2016; U.S. Pat. No. 9,274,157, issued Mar. 1, 2016; U.S. Pat. No. 9,312,575, issued Apr. 12, 2016; U.S. Pat. No. 9,335,362, issued May 10, 2016; U.S. Pat. No. 9,425,487, issued Aug. 23, 2016; U.S. Pat. No. 9,419,311, issued Aug. 16, 2016; U.S. Pat. No. 9,496,720, issued Nov. 15, 2016; U.S. Pat. No. 9,588,185, issued Mar. 7, 2017; U.S. Pat. No. 9,923,289, issued Mar. 20, 2018; U.S. Pat. No. 9,966,676, issued May 8, 2018; U.S. Pat. No. 10,046,649, issued Aug. 14, 2018; U.S. Pat. No. 10,222,397, issued Mar. 5, 2019; U.S. Pat. No. 10,317,468, issued Jun. 11, 2019; U.S. Pat. No. 10,429,449, issued Oct. 1, 2019; U.S. Ser. No. 09/780,146, filed Feb. 9, 2001, entitled STORAGE BATTERY WITH INTEGRAL BATTERY TESTER; U.S. Ser. No. 09/756,638, filed Jan. 8, 2001, entitled METHOD AND APPARATUS FOR DETERMINING BATTERY PROPERTIES FROM COMPLEX IMPEDANCE/ADMITTANCE; U.S. Ser. No. 09/862,783, filed May 21, 2001, entitled METHOD AND APPARATUS FOR TESTING CELLS AND BATTERIES EMBEDDED IN SERIES/PARALLEL SYSTEMS; U.S. Ser. No. 09/880,473, filed Jun. 13, 2001; entitled BATTERY TEST MODULE; U.S. Ser. No. 10/109,734, filed Mar. 28, 2002, entitled APPARATUS AND METHOD FOR COUNTERACTING SELF DISCHARGE IN A STORAGE BATTERY; U.S. Ser. No. 10/263,473, filed Oct. 2, 2002, entitled ELECTRONIC BATTERY TESTER WITH RELATIVE TEST OUTPUT; U.S. Ser. No. 09/653,963, filed Sep. 1, 2000, entitled SYSTEM AND METHOD FOR CONTROLLING POWER GENERATION AND STORAGE; U.S. Ser. No. 10/174,110, filed Jun. 18, 2002, entitled DAYTIME RUNNING LIGHT CONTROL USING AN INTELLIGENT POWER MANAGEMENT SYSTEM; U.S. Ser. No. 10/258,441, filed Apr. 9, 2003, entitled CURRENT MEASURING CIRCUIT SUITED FOR BATTERIES; U.S. Ser. No. 10/681,666, filed Oct. 8, 2003, entitled ELECTRONIC BATTERY TESTER WITH PROBE LIGHT; U.S. Ser. No. 11/207,419, filed Aug. 19, 2005, entitled SYSTEM FOR AUTOMATICALLY GATHERING BATTERY INFORMATION FOR USE DURING BATTERY TESTER/CHARGING, U.S. Ser. No. 11/356,443, filed Feb. 16, 2006, entitled ELECTRONIC BATTERY TESTER WITH NETWORK COMMUNICATION; U.S. Ser. No. 12/697,485, filed Feb. 1, 2010, entitled ELECTRONIC BATTERY TESTER; U.S. Ser. No. 12/769,911, filed Apr. 29, 2010, entitled STATIONARY BATTERY TESTER; U.S. Ser. No. 13/098,661, filed May 2, 2011, entitled METHOD AND APPARATUS FOR MEASURING A PARAMETER OF A VEHICLE ELECTRICAL SYSTEM; U.S. Ser. No. 13/152,711, filed Jun. 3, 2011, entitled BATTERY PACK MAINTENANCE FOR ELECTRIC VEHICLE; U.S. Ser. No. 14/039,746, filed Sep. 27, 2013, entitled BATTERY PACK MAINTENANCE FOR ELECTRIC VEHICLE; U.S. Ser. No. 14/565,689, filed Dec. 10, 2014, entitled BATTERY TESTER AND BATTERY REGISTRATION TOOL; U.S. Ser. No. 14/799,120, filed Jul. 14, 2015, entitled AUTOMOTIVE MAINTENANCE SYSTEM; U.S. Ser. No. 15/017,887, filed Feb. 8, 2016, entitled METHOD AND APPARATUS FOR MEASURING A PARAMETER OF A VEHICLE ELECTRICAL SYSTEM; U.S. Ser. No. 15/049,483, filed Feb. 22, 2016, entitled BATTERY TESTER FOR ELECTRIC VEHICLE; U.S. Ser. No. 15/077,975, filed Mar. 23, 2016, entitled BATTERY MAINTENANCE SYSTEM; U.S. Ser. No. 15/140,820, filed Apr. 28, 2016, entitled CALIBRATION AND PROGRAMMING OF IN-VEHICLE BATTERY SENSOR; U.S. Ser. No. 15/149,579, filed May 9, 2016, entitled BATTERY TESTER FOR ELECTRIC VEHICLE; U.S. Ser. No. 15/634,491, filed Jun. 27, 2017, entitled BATTERY CLAMP; U.S. Ser. No. 15/791,772, field Oct. 24, 2017, entitled ELECTRICAL LOAD FOR ELECTRONIC BATTERY TESTER AND ELECTRONIC BATTERY TESTER INCLUDING SUCH ELECTRICAL LOAD; U.S. Ser. No. 16/021,538, filed Jun. 28, 2018, entitled BATTERY PACK MAINTENANCE FOR ELECTRIC VEHICLE; U.S. Ser. No. 16/056,991, filed Aug. 7, 2018, entitled HYBRID AND ELECTRIC VEHICLE BATTERY PACK MAINTENANCE DEVICE, U.S. Ser. No. 16/253,526, filed Jan. 22, 2019, entitled HIGH CAPACITY BATTERY BALANCER; U.S. Ser. No. 16/253,549, filed Jan. 22, 2019, entitled HYBRID AND ELECTRIC VEHICLE BATTERY PACK MAINTENANCE DEVICE; U.S. Ser. No. 16/297,975, filed Mar. 11, 2019, entitled HIGH USE BATTERY PACK MAINTENANCE; all of which are incorporated herein by reference in their entireties.

During operation, the device 200 is capable of measuring a parameter of the battery 140 through the Kelvin connections 206 and 208. For example, a forcing function signal can be applied by forcing function 210. Measurement circuitry 212 can monitor the effect of the applied forcing function signal on the battery 140 and responsively provide an output to the microprocessor 214. This can be used to measure a dynamic parameter of the battery 140 such as dynamic conductance, etc. Embodiments of the present disclosure are not limited to this particular testing method and other techniques may also be employed.

Further, the testing of the battery 140 or the group of batteries 140 may be performed using sensors within battery pack 102. In such a configuration, the testing may be performed without disassembling the battery pack 102. Here, the microprocessor 214 can operate in accordance with programming instructions stored in the memory 220, which can also store information by microprocessor 214. Operation of device 200 can be controlled through the I/O circuitry 221 which can comprise, for example, a manual input such as a keyboard, a mouse, a touchscreen, and/or an output such as a display.

As discussed below in greater detail, measured parameters of the battery 140 can be stored in the memory 220 or the database 222 for subsequent retrieval. The database 222 may be implemented in any suitable database format. In one configuration, the database 222 may be implemented manually. In another configuration, the database is stored in a memory, for example, a computer memory.

Figure 3:
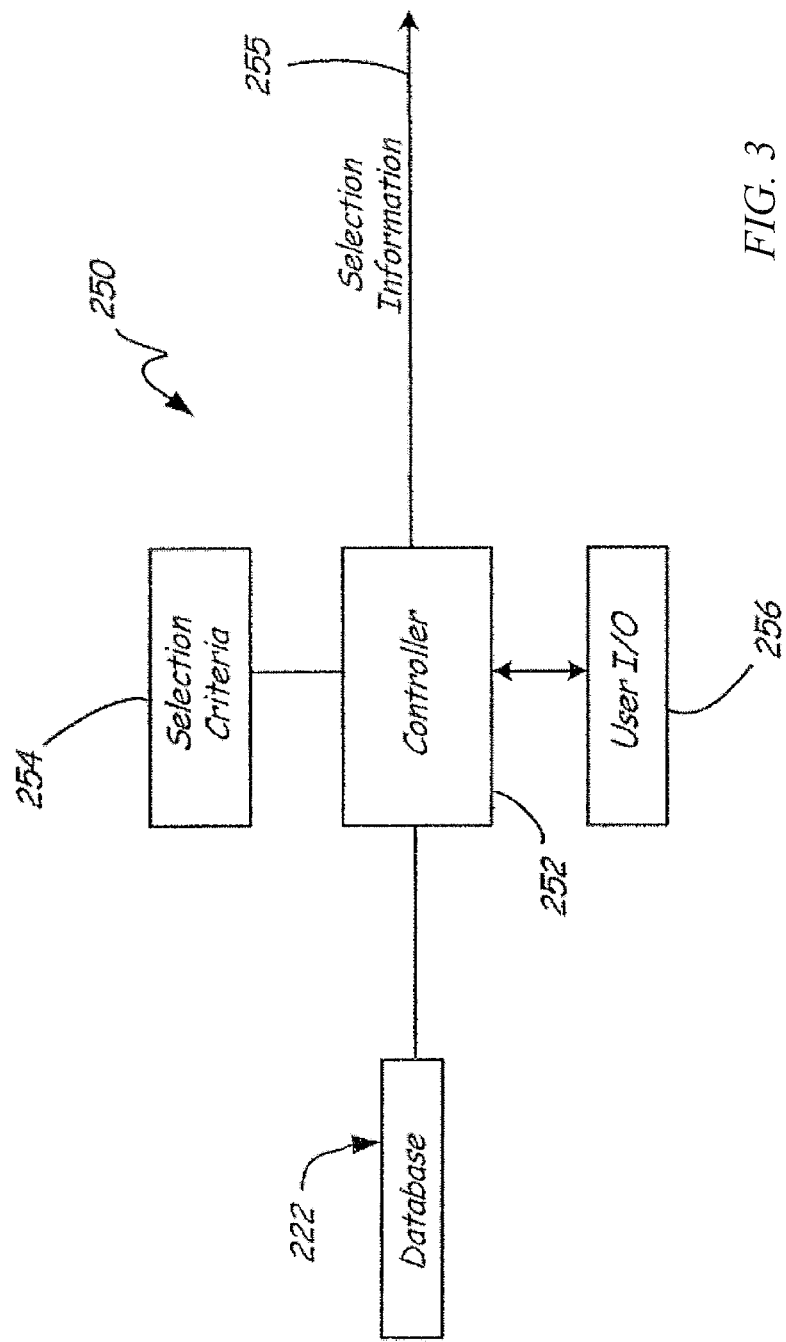
FIG. 3 is a simplified block diagram of a device for use in selecting batteries for use in refurbishing a battery pack, in accordance with embodiments of the present disclosure.

FIG. 3 is a simplified block diagram of a battery selection system 250 in accordance with one example embodiment of the present disclosure. Battery selection system 250 can be embodied in the device 200 or the maintenance circuitry 201 shown in FIG. 2, or can be a separate system. System 250 may typically be implemented in a computer or microprocessor system and is configured to access information from the database 222. The system 250 may include a controller 252 comprising one or more processors that is configured to communicate with the database 222, and battery selection criteria 254. The controller 252 examines battery parameters and other battery information stored in the database 222 for each of a plurality of candidate replacement batteries based upon the selection criteria 254. Based upon this examination, the controller 252 provides a selection information output 255, which identifies one or more batteries from the database 222 that are candidates for forming a refurbished battery pack 102. The selection information output 255 may also include information related to a specific location in which a candidate battery 140 should be located within the physical or electrical configuration of the battery pack 102.

The system 250 may include input/output circuitry 256, which may include a physical input device such as a keypad, a mouse, and/or a touchscreen, and/or an output device such as a display. The input/output circuitry 256 can be used to provide instructions to the controller 252, and provide a means for the controller 252 to provide an output to an operator, such as the selection information output 255. The selection information output 255 may be delivered through the input/output circuitry 256 or through some other means, such as communicated over a wired or wireless communication link (e.g., network) to a remote location.

The selection criteria 254 can be updated as desired. In some configurations, the controller 252 can also be configured to modify data within the database 222. The selection criteria 254 and the database 222 can be implemented in any suitable non-transitory memory, such as memory 220 shown in FIG. 2.

Figures 4, 5:
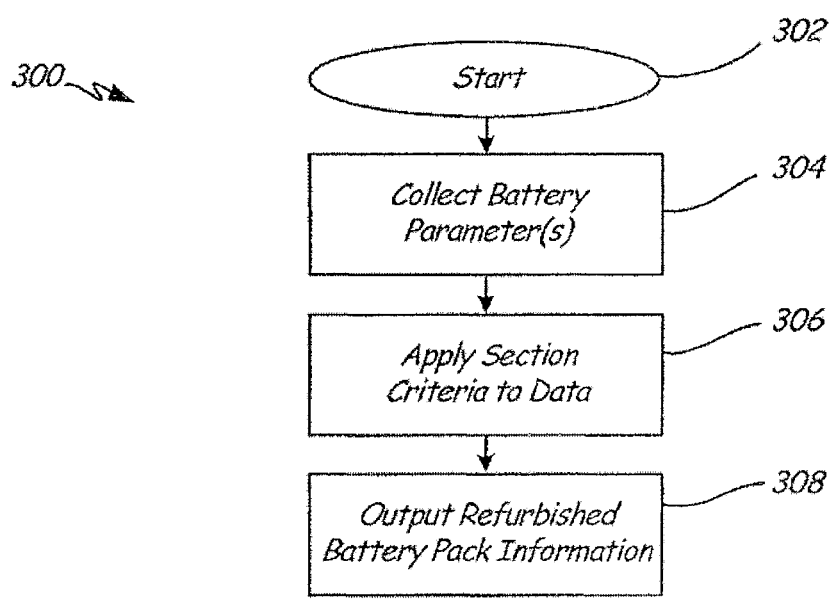
FIG. 4 illustrates an example of a database, in accordance with embodiments of the present disclosure.
FIG. 5 is a flowchart showing steps for refurbishing a battery pack, in accordance with embodiments of the present disclosure.

FIG. 4 shows an example configuration of the database 222 containing battery information. In some embodiments, database 222 includes a number of different fields, each containing battery information. Each row of the database 222 may contain battery information for a particular battery 140, such as a battery from within an existing battery pack 102, a new battery, a used battery, or a refurbished battery, for example. A battery identification field 224 is used to store information that identifies the battery 140. The fields of the database 222 may also include one or more battery parameters 226 for each of the batteries in the database 222. In some configurations, more than one battery parameter 226 is associated with one specific battery 140.

The battery identification 224 can be in accordance with any technique which will provide information that can be used to identify a battery. This may include, for example, a serial number, a code, or the like. The identifying information contained in the field 224 can be created during the refurbishing process, or at some other time, for example, during manufacture of a battery 140 or pack 102. This information may be manually entered into the database 222 using, for example, input/output circuitry 221 shown in FIG. 2, or input/output circuitry 256 shown in FIG. 3, or may be entered into the database 222 using more automated techniques such as a barcode scanner, RFID tag, etc. Input/output circuitry 221 and 256 may comprise such input devices.

The battery parameters 226 may comprise any battery information which is related to an identified battery 140. The battery information can include test information, such as measured or obtained parameters relating to a test performed on the battery, or information obtained through other means. The information may include information identifying or relating to an age of the battery, information related to whether the battery 140 came from a battery pack 102 in which an operator has or has not identified any problems, manufacturing information, geographic location information, information related to a location of a battery within the battery pack 102, a battery type, a condition of the battery, etc. The battery information contained in the fields 226 may also include parameters collected by testing the battery, such as a temperature, test results of any type of battery test or data measured or collected prior to, during, or after a test is performed. The battery information contained in the database 222 is not limited to the examples discussed herein. Additionally, each row of the data corresponding to one of the identified batteries may be considered as a battery record, which may be communicated to a remote location along with other information, such as an image of the battery, as discussed below.

FIG. 5 is flowchart 300 that includes method steps in accordance with one example embodiment of the present disclosure. The steps begin at start block 302. At block 304 battery parameters are collected as discussed above. These battery parameters are stored in the database 222 and associated with information which identifies a respective battery 140. This collection of information may form at least a portion of a battery record for the battery 140. At block 306, the selection criteria 254 is applied to the data contained in database 222. Based upon this selection criteria, at block 308, the controller 352 shown in FIG. 4 provides selection information output 255, which identifies refurbished battery pack information as discussed above.

During operation of the system discussed above, any bad batteries 140 within the battery pack 102 are identified by testing and removed from the battery pack 102. This may require that the battery pack 102 be charged and discharged using, for example the maintenance circuitry 201. Further, remaining batteries 140 in the battery pack 102, as well as any replacement batteries 140, may be charged or discharged such that they are all at approximately the same state of charge.

The batteries 140 may be tested while remaining in the pack 102 through connections at individual points between multiple batteries. In another example, the entire battery pack 102 may be tested by supplying a known current to the entire pack 102, or a portion of the pack 102. This current may be a DC current, a time varying DC current, a bi-polar current, a uni-polar AC current, etc. While the current is applied, a battery 140 or groups of batteries 140 within the battery pack 102 can be monitored. This monitoring may be through sensors which are internal to the battery pack 102 or through sensors which are applied to the battery pack 102 or individual batteries 140.

As mentioned above, in a high voltage string of batteries 140 of a pack 102, simply replacing one faulty battery 140 with a new battery 140 may not provide an optimal solution in refurbishing the battery pack 102. This is because the replacement battery 140 may be out of balance with the other batteries 140 in the battery pack 102. Thus, it is desirable that the batteries 140 in the battery pack 102 be balanced in such a way that they have a similar capacity, state of charge, voltage, impedance, conductance, and/or another parameter, depending upon the selection criteria 254.

The particular selection criteria 254 can be selected as desired. For example, the selection criteria 254 can be determined by testing many batteries 140 across many different battery packs 102 and identifying which parameter or parameters 226 will have a detrimental impact if they are "out of balance" with other batteries 140 within a battery pack 102, identifying a range of acceptable values of a particular parameter 226, identifying an interrelationship between multiple parameters 226, and/or identifying a particular physical or electrical configuration of such batteries 140 within a battery pack 102. Using a load test as an example, a group of batteries 140 may be fully charged and then discharged for a period of time at a desired discharged rate, such as using charging and discharging circuitry of the maintenance circuitry 201. The voltage of the batteries 140 during or following the discharge can be measured using the maintenance circuitry 201. Batteries 140 having a voltage that is within a selected percentage of the voltage of other batteries 140 may be identified for use in a refurbished battery pack 102.

This selection process may be applied only to batteries 140 which are used to replace faulty batteries 140 within a battery pack 102, or may be applied to additional batteries 140 within the battery pack 102 including all of the batteries 140 within a particular battery pack 102. Further, the batteries 140 which are used to replace faulty batteries 140 may themselves be retrieved from other battery packs 102 which are in the process of being refurbished or otherwise disassembled. The replacement batteries 140 may also comprise new or otherwise unused batteries 140.

Some embodiments of the present disclosure provide improvements to battery pack maintenance processes using an image of the battery pack 102 and/or images of individual batteries 140 within the battery pack 102. In some embodiments, an image of the battery pack 102 is used to associate a specific battery 140 within the battery pack 102 to corresponding maintenance performed on the battery 140. Additionally, battery information associated with a battery 140 may be supplemented by the image of the battery 140 or the battery pack 102, in which it is or was contained. The image of the battery pack 102 and/or batteries 140 may also be used to assist a technician in performing battery maintenance operations on the battery pack 102 or battery 140, and/or provide other benefits.

Figure 6:
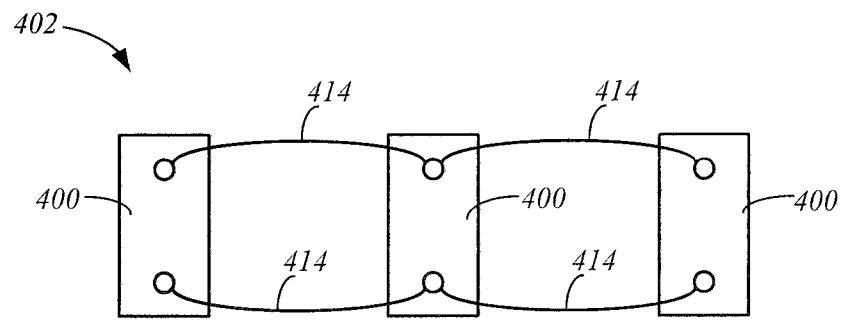
FIGS. 6 and 7 are simplified diagrams of examples of battery packs, in accordance with embodiments of the present disclosure.
Figure 7:
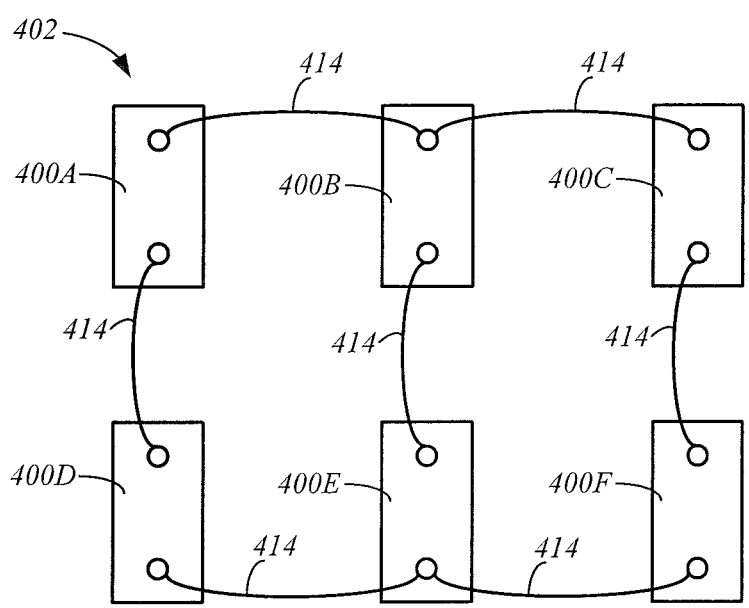

As mentioned above, battery packs 102 are subject to testing and/or charging and may take on numerous forms. For example, batteries 400 within a battery pack 402 may be connected in series, such as shown in the simplified diagram of FIG. 6. In FIG. 7, the batteries 400A-F are shown as being connected in series and in parallel. The batteries 400 may also be connected in another manner. Additionally, a set of batteries 400 may be presented to a technician responsible for testing and/or charging the batteries without the batteries 400 being in a battery pack configuration, such as a group of batteries on a pallet, for example. Embodiments of the present disclosure apply to battery packs 402 formed by a plurality of interconnected batteries 400, as well as groups of independent batteries.

Figure 8:
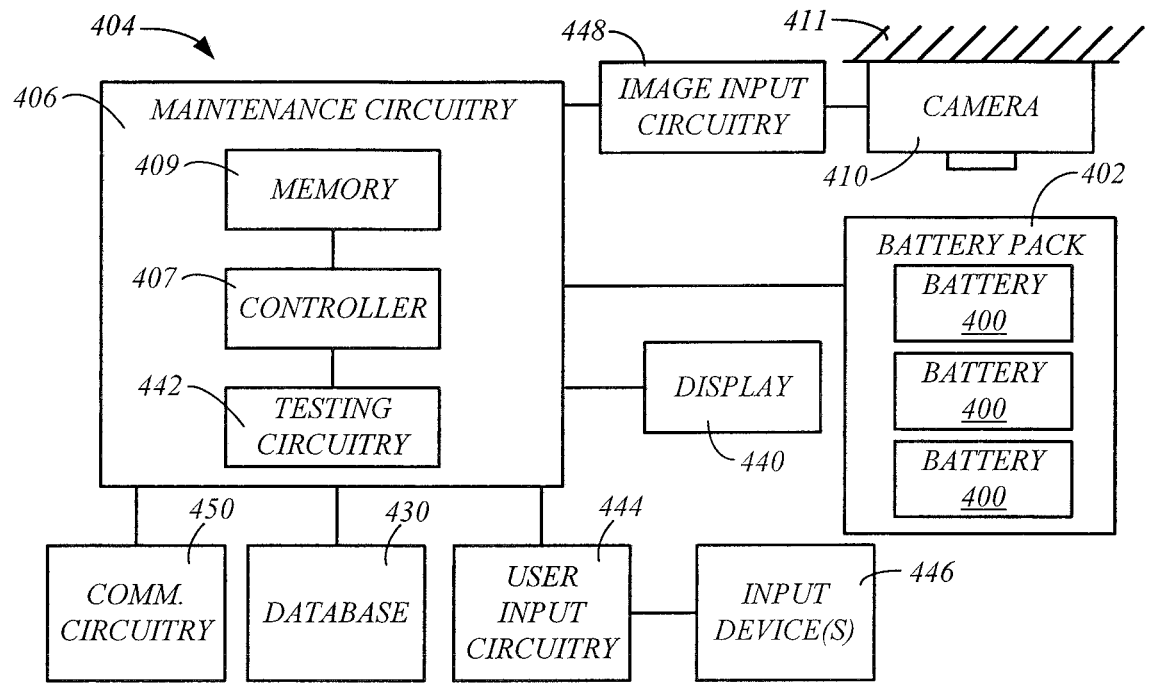
FIG. 8 is a simplified diagram of a battery maintenance system, in accordance with embodiments of the present disclosure.

FIG. 8 is a simplified diagram of a battery maintenance system 404, in accordance with embodiments of the present disclosure. The battery maintenance system 404 includes maintenance circuitry 406 that is configured to perform a maintenance operation on a battery pack 402 having a plurality of batteries 400, such as described above.

In some embodiments, the circuitry 406 includes a controller 407 that includes at least one processor for performing one or more functions described herein in response to the execution of program instructions stored in a suitable non-transitory computer-readable medium, such as memory 409. Examples of these functions include performing tests on a battery 400 or a group or pack 402 of the batteries 400, charging a battery 400 or a group or pack 402 of the batteries 400, receiving user input, generating a display of an image of the pack 402 or a battery 400 on a display 440, such as in a graphical user interface (GUI) on the display, processing images, and/or other functions described herein.

The maintenance circuitry 406 may include testing circuitry 442 for performing a maintenance operation, such as a test, on an individual battery 400 or the battery pack 402, through one or more suitable connections (e.g., Kelvin connections). The testing circuitry 442 may be configured in accordance with aspects of the device 200 (FIG. 2) discussed above, or in accordance with circuitry configured to perform one or more battery tests disclosed in the patents and patent applications cited above. The testing circuitry 442 may include charging/discharging circuitry for use during a battery test or maintenance operation to charge and/or discharge an individual or group of the batteries 400, in accordance with the techniques described above and techniques disclosed in the patents and patent applications cited above.

In some embodiments, the system 404 includes user input circuitry 444 configured to receive user input through one or more user input devices 446. Examples of user input devices 446 include a keyboard, a mouse, a touchscreen display, and other suitable input devices. The display 440 of the system 404 may be a touchscreen display, which may also operate as an input device 446. The system 404 may include additional input and output devices.

In some embodiments, the system 404 is configured to receive one or more images or video, such as through image input circuitry 448. The controller 407 of the measurement circuitry 406 may be configured to process the images and/or video as necessary to perform functions described herein.

The system 404 may include a camera 410 that captures the images and/or video and provides the images to the image input circuitry 448 through a suitable wired (e.g., USB cable, ethernet cable, etc.) or wireless (Wi-Fi, Bluetooth, NFC, etc.) communication link. The camera 410 may take the form of a camera that is dedicated to the system 404, or a user's camera (e.g., smartphone camera). The one or more images may include an image of the battery pack 402 and/or an image of an individual battery 400 of the pack 402, on which a maintenance operation is to be performed by the maintenance circuitry 406. The video may include a video of maintenance operations performed on the battery pack 402 or an individual battery 400 by a technician. In some embodiments, the system 404 includes a support structure 411 for the camera 410 to position the camera 410 to capture one or more images of the battery pack 402 or individual batteries 400 of the pack 402.

Figure 9:
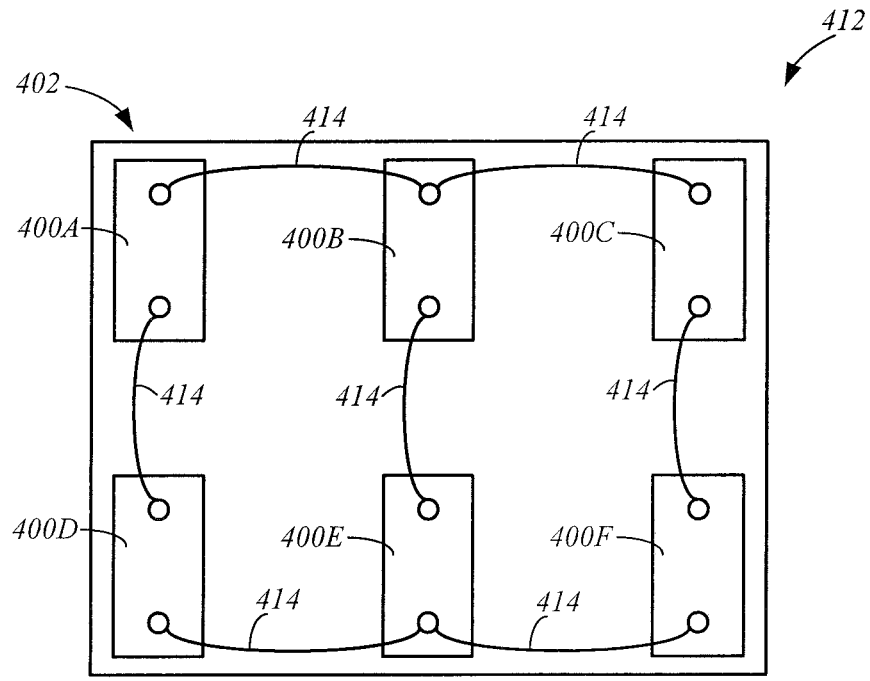
FIG. 9 is an example of an image of a battery pack captured by a camera of the maintenance system of FIG. 8.

FIG. 9 is an example of an image 412 of a battery pack 402 that may be captured by the camera 410. In some embodiments, the image 412 includes all of the batteries 400 of the battery pack 402, and also may include various connections 414 between the batteries 400, and possibly connections to the maintenance circuitry 406.

In some embodiments, the controller 407 is configured to present one of the images 412 received by the image input circuitry 448 on the display 440. The received image 412 may also be stored in the memory 409, a database 430, or another suitable storage device. In some embodiments, the controller 407 generates a graphical user interface (GUI) that uses the received image 412. The GUI may be configured to assist a technician in performing maintenance on a battery 400 or a battery pack 402. For example, in some embodiments, the GUI presented on the display 440 includes the image 412 received by the image input circuitry 448 of the battery pack 402 or an individual battery 400, or a processed version thereof, along with a graphical overlay that may be used by the technician to identify individual batteries 400 within the image 412. The technician may edit and manipulate the overlay of the GUI to facilitate the identification and/or selection of the individual batteries 400 of the battery pack 402.

Figure 10:
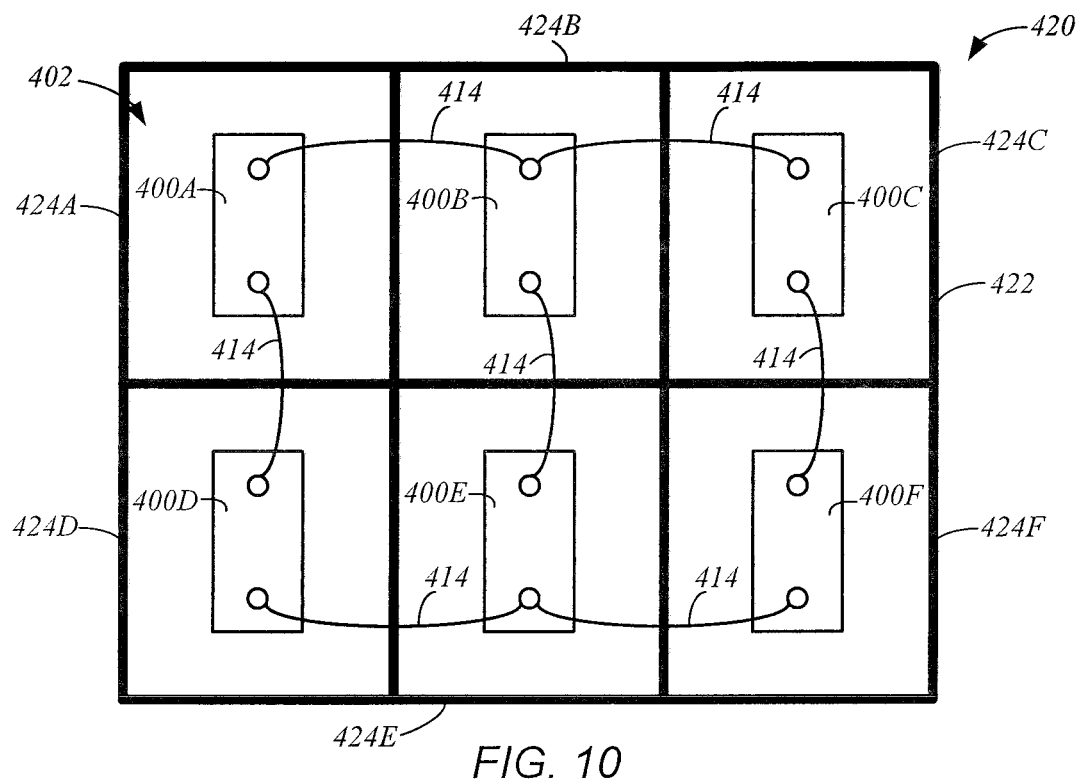
FIGS. 10-16 are simplified diagrams of graphical user interfaces, in accordance with embodiments of the present disclosure.

FIGS. 10-16 are simplified diagrams illustrating various aspects of a GUI 420 provided on the display 440, in accordance with embodiments of the present disclosure. FIG. 10 illustrates an example of the GUI 420 having the image 412 of FIG. 9 and a graphical overlay 422 (thick lines), in accordance with embodiments of the present disclosure.

In some embodiments, the overlay 422 includes multiple boundaries 424, each of which is configured to contain one of the batteries 400 of the battery pack 402. In the example shown in FIG. 10, the boundaries 424 are in the form of boxes, such as boxes 424A-F that each contain one of the batteries 400A-F of the battery pack 402. Other shapes for the boundaries 424 may also be used. The boundaries 424 may initially be generated by the circuitry 406 of the system 404 based on user input, such as an identification of the type of battery pack 402 that is to be tested and/or charged.

The technician may edit the boundaries 424 as necessary to ensure that each boundary 424 contains one of the batteries 400 of the battery pack 402, by providing a boundary input to the maintenance circuitry, such as through a suitable input device 446 (e.g., a keyboard, a mouse, a touchscreen, etc.). For example, the technician may select a boundary 424 and provide the boundary input by resizing the boundary 424, such as by dragging an edge of the boundary 424 using the input device 446. Alternatively, the technician may input the boundaries 424 using, for example, a touchscreen display, by drawing the boundaries 424 around each of the batteries 400 of the pack 402, or around one of the batteries 400 that is to be addressed by the maintenance circuitry 406, using a suitable input device 446. The drawn boundaries 424 may also be edited by the technician using the input device 446.

In some embodiments, the user input circuitry 444 is configured to receive a battery selection user input identifying a selected battery 400 of the pack 402, such as from a suitable input device 446. This selection of one of the batteries 400 may cause the maintenance circuitry 406 to associate the selected battery 400 with a maintenance operation on the selected battery 400. The associated maintenance operation could be a maintenance operation that is performed subsequent to the selection of the battery 400, or a maintenance operation that was previously performed on the selected battery 400. The battery selection by the user may cause other functions to be performed, such as displaying battery information relating to the selected battery 400 on the display 440, performing a maintenance operation on the selected battery 400, and/or other functions described herein.

This battery selection process may be facilitated using the GUI 420. In some embodiments, the boundaries 424 each define a user-selectable area of the GUI 420, and the battery selection user input received by the user input circuitry includes a selection of one of the user-selectable areas using a suitable input device 446. For example, a technician may select an individual battery 400 of the pack 402 by clicking within the corresponding boundary 424 surrounding the desired battery 400 using a suitable input device 446, such as a mouse or a touchscreen display.

In some embodiments, the selection of a battery 400 through the selection of the user-selectable area of the GUI 420 causes the GUI 420 to highlight the selected boundary 424 and/or the area within the boundary 424. For example, when the technician selects the area within the boundary 424A, the area may be highlighted to represent the selection of the battery 400A contained within the boundary 424A, as indicated in the GUI example shown in FIG. 11.

Figure 12:
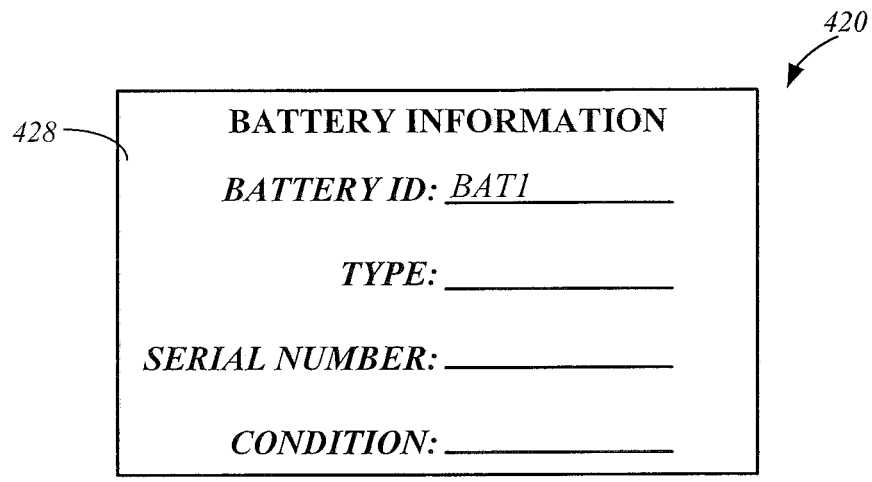

In some embodiments, the GUI 420 facilitates the display of battery information for selected batteries 400 through an information window or screen of the GUI 420. For example, a window or screen 428 (hereinafter "screen") containing battery information, an example of which is shown in FIG. 12, may be presented to the technician by the GUI 420, such as after the selection of one of the batteries 400. The battery information on the screen 428 may include the information described above, such as test results from a test performed on the selected battery, a battery identification for the selected battery (e.g., "BAT1"), a battery type of the selected battery, a number corresponding to the selected battery, a serial number of the selected battery, a description of a condition of the selected battery, a position of the selected battery within the battery pack 402, and/or other information relating to the selected battery.

In some embodiments, the technician may edit or input the battery information on the selected battery 400 through the screen 428 based on a battery information user input received through the user input circuitry 444. This data editing or entry process may be completed for each of the batteries 400 by the technician, after which the GUI 420 may update the overlay 422 to include the updated battery information. For example, the technician may enter battery information user input in the form of battery identifications (e.g., BAT1, BAT2, etc.) for each of the batteries 400, by selecting each of the batteries through the GUI 420. The image 412 may then be updated in accordance with the updated battery information, as indicated by the display of the updated battery identifications in FIG. 13, and saved in memory 409 of the system 404, a database 430 (FIG. 8), and/or other memory. Other battery information corresponding to the individual batteries 400 may also be displayed in the image 412, such as within each of the boundaries 424, for example.

Figure 13:
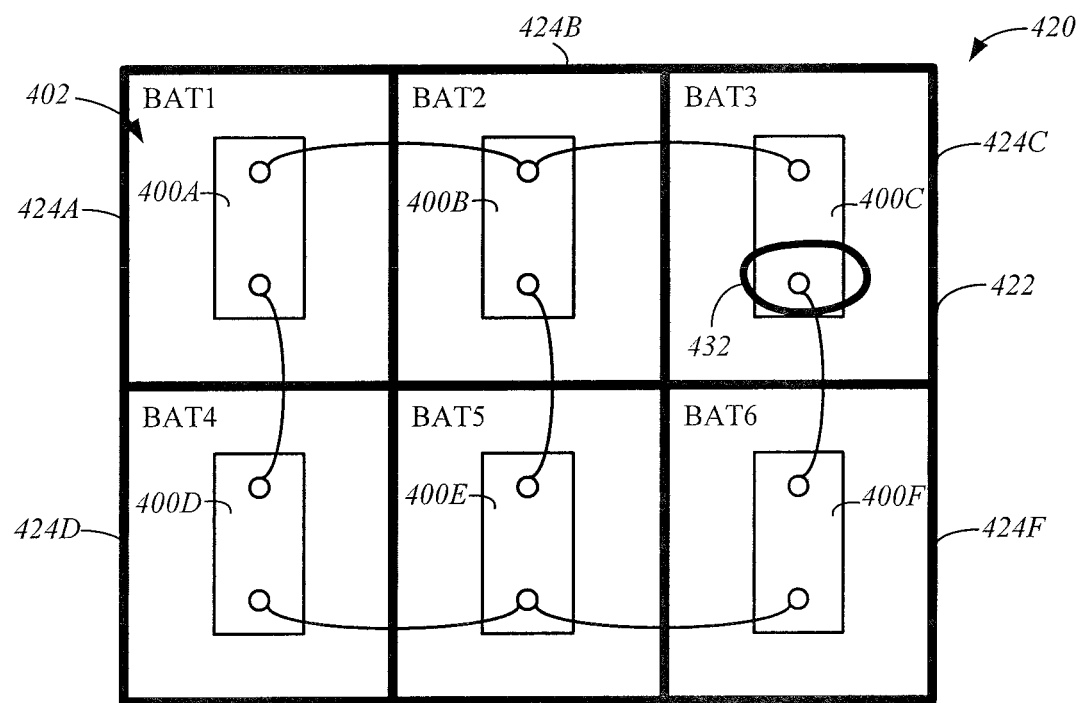
Figure 14:
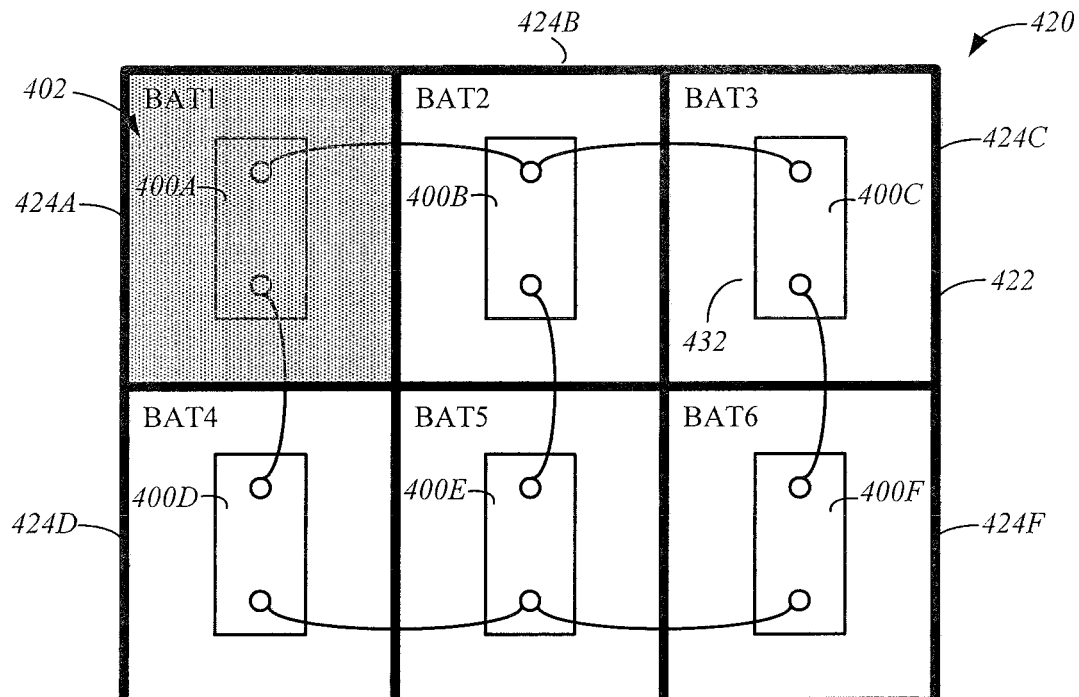
Figure 15:
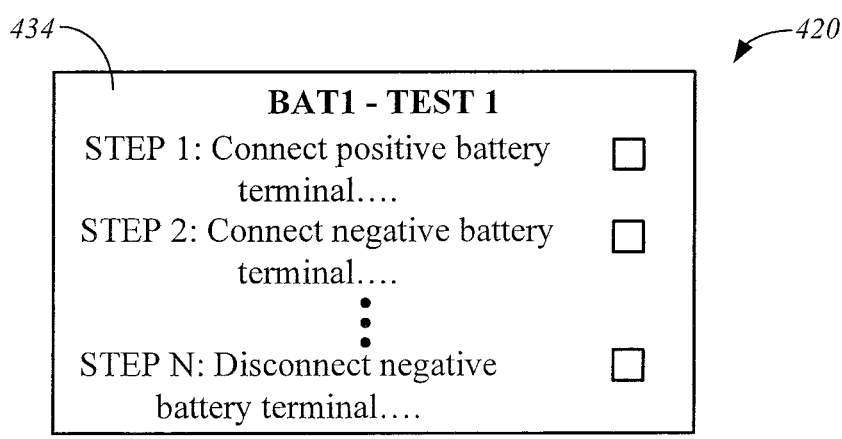

In some embodiments, the technician or user may edit the image 412 of the GUI (FIG. 14) as desired. This may involve rearranging the images of the batteries 400 within the GUI 420, such as by selecting and moving a boundary 424 with its corresponding battery 400 using a suitable input device 446. For example, one may switch the location of "BAT2" with that of "BAT6" by dragging the user-selectable area of "BAT2" to the location of the user-selectable area of "BAT6" using a suitable input device 446. Additionally, the user may annotate the image 412 presented by the GUI 420 to include notes or drawings. For example, using an input device 446, a user may draw a circle 432 around a battery terminal of "BAT3" to identify an issue with the terminal, as shown in FIG. 13.

A technician may select one of the batteries 400, such as battery "BAT1", to begin a maintenance operation, such as testing and/or charging of the battery 400A corresponding to battery "BAT1" using the maintenance circuitry. This selection may be through the GUI 420, such as by selecting the user-selectable area corresponding to a desired battery using an input device. The GUI 420 may highlight the selection with the overlay 422, as indicated in the GUI 420 of FIG. 14.

In some embodiments, the GUI 420 assists the technician in performing the maintenance operation by displaying information relating to the maintenance operation on the display 440. For example, the GUI 420 may present a screen or image on the display 440 having instructions of the process steps that are to be performed on the selected battery, such as indicated by the window or screen 434 shown in the GUI 420 of FIG. 15, displaying one or more images of the process steps, showing a video of one or more of the process steps, and/or displaying other information relating to the maintenance operation.

Figure 16:
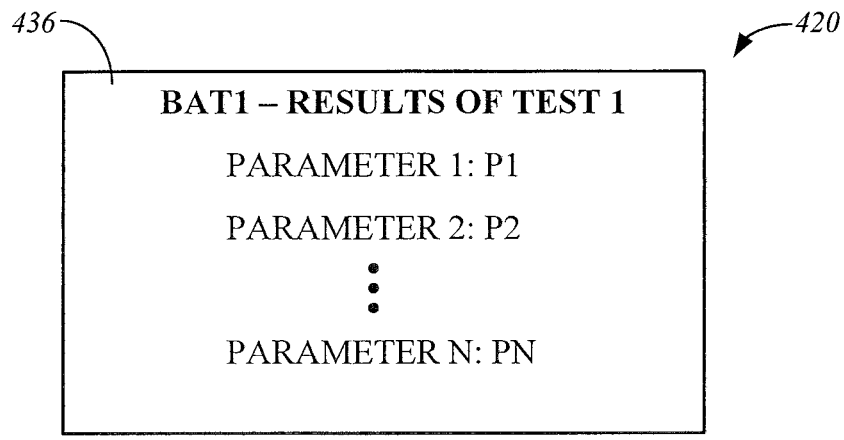

After completing the maintenance operation, the GUI 420 may present results of the operation on the selected battery, such as test results, in a window or screen 436, an example of which is shown in the GUI 420 of FIG. 16. These test results may include various measured parameters, such as static parameters, dynamic parameters, load testing parameters, capacitance, state of charge, and voltage, for example. The test results may be stored in memory of the system 404, the database 430, or another suitable non-transitory computer-readable medium.

The GUI 420 may be used to retrieve test results or other battery information for each of the batteries 400. This information may be contained in a battery record, such as discussed above. For example, the user may select "BAT2" in the GUI 420 of FIG. 13, such as through the selection of the corresponding user-selectable area for "BAT2" to retrieve the corresponding battery record, test results or other battery information for the battery "BAT2" (battery 400B). In some embodiments, the battery record, test results or other battery information includes the image of the battery captured by the camera 410. This image may comprise a subset of the image of the battery pack 402, such as the portion of the image that is within the boundary 424 of the selected battery 400.

The battery record, test results or other battery information may be communicated by the system 404 to a remote location or third party, such as a customer, using communications circuitry 450 of the system 404, shown in FIG. 8. The communications circuitry 450 may perform this communication in accordance with any suitable data communication protocol, and perform the communication over a wired or wireless communication link.

In some embodiments, the one or more images of the battery pack 402 captured by the camera 410, may include the connections 414 between the batteries 400 prior to disconnecting the connections to perform maintenance processes on the batteries 400, such as shown in FIGS. 9 and 10. In some embodiments, the GUI 420 may present the image to the technician to assist in reconnecting the batteries 400.

The images associated with the batteries 400 or packs 402, such as those captured by the camera 410 and/or stored in the database 430 or memory 409 of the system 404, may also be used for future reference. For example, the images may be used to provide evidence of the condition of the batteries 400 at the time a maintenance operation was performed. The images may also be used to show a customer the condition of the batteries 400, and to illustrate various battery configurations.

Figure 17:
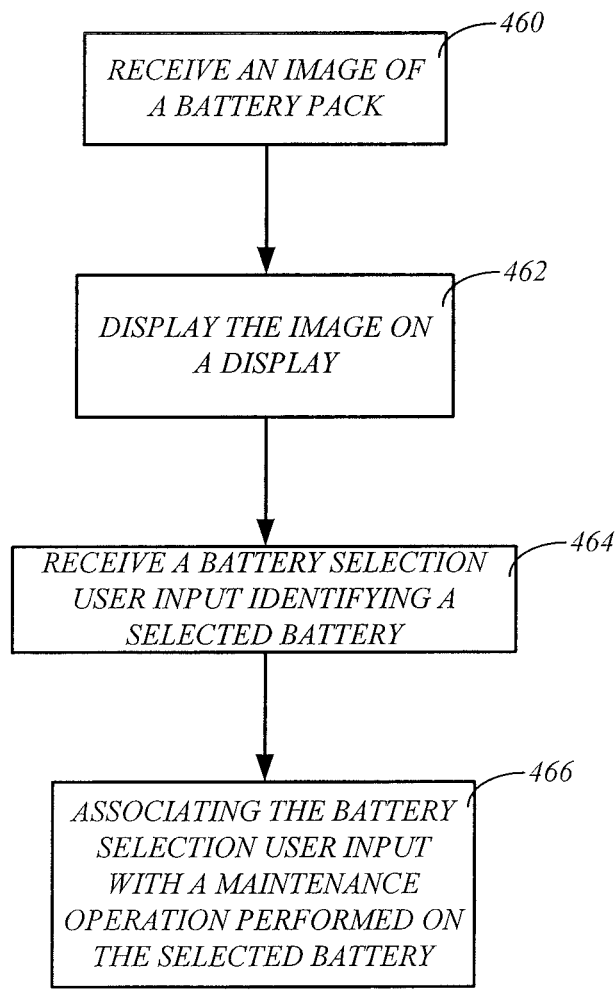
FIG. 17 is a flowchart illustrating a method in accordance with embodiments of the present disclosure.

Some embodiments of the present disclosure are directed to a method performed by the system 404. FIG. 17 is a flowchart of an example of such a method, in accordance with embodiments of the present disclosure.

At 460 of the method, an image 412 of the battery pack 402 or a group of batteries 400, which may be captured using the camera 410, is received by the image input circuitry 448 of the system 404 (FIG. 8). This may be in response to a user input to the system 404. At 462 of the method, the image 420, as captured or subsequent to processing by the maintenance circuitry 406, is presented on a display 440 of the system 404. In some embodiments, a GUI 420 is provided on the display 440 that includes the image 412 (FIG. 10).

Figure 11:
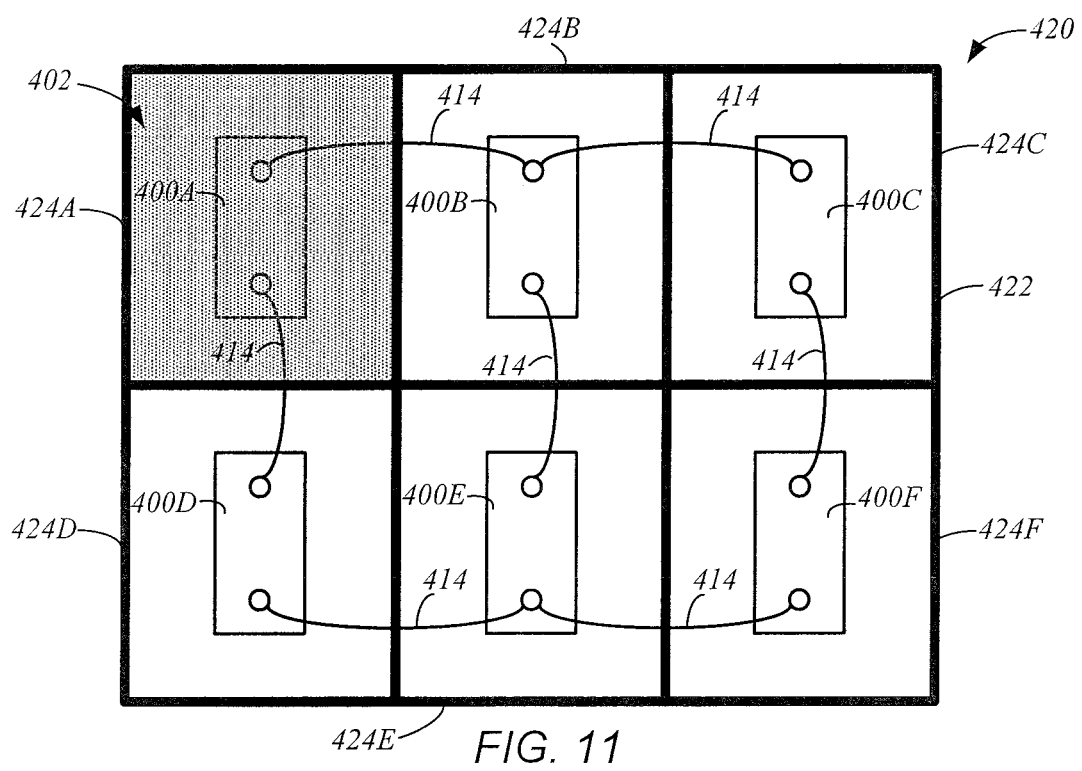

At 464 of the method, a battery selection user input is received by the user input circuitry 444 of the system 404. This may involve clicking or touching the GUI 420 within a boundary 424 (FIG. 10) corresponding to the selected battery, for example. In some embodiments, this selection is highlighted in the GUI 420, such as shown in FIG. 11.

At 466 of the method, the battery selection user input is associated with a maintenance operation performed on the selected battery using the maintenance circuitry 406 of the system 404. For example, the controller 407 may associate the battery selection user input with a battery record containing battery and/or testing information corresponding to the selected battery, or associate the battery selection user input with a subsequent maintenance operation or test performed on the selected battery, for example.

The selection of one of the batteries 400 may allow the user to enter information pertaining to the selected battery 400, such as discussed above with reference to FIG. 12. The entered information may be presented in the GUI 420, as shown in FIG. 13.

The selection of one of the batteries 400, such as through the GUI 420, may also initiate testing of the battery 400. In some embodiments, the GUI 420 may present information to assist the user in performing the battery test, such as a list of process steps (FIG. 15) and/or other information (e.g., images, video, etc.). Once the battery 400 is ready for testing, such as after proper connections are made between the battery 400 and the maintenance circuitry 406, the user may initiate the testing process through the GUI 420.

Following the test, the GUI 420 may present the test results to the user, and save the test results along with the image of the batteries for future reference, such as in a battery record. Additionally, the GUI 420 may present the user with an image that illustrates the connections 414 of the batteries 400 prior to the testing, to assist the user in properly reconnecting the batteries 400 after performing a maintenance operation on the selected battery.

Although the embodiments of the present disclosure have been described with reference to preferred embodiments, workers skilled in the art will recognize that changes may be made in form and detail without departing from the spirit and scope of the disclosed embodiments.

What is claimed is:

1. A battery pack maintenance system comprising:
   maintenance circuitry configured to perform a maintenance operation on a battery pack having a plurality of batteries;
   image input circuitry configured to receive an image of the battery pack;
   a display configured to display the image;
   user input circuitry configured to receive a battery selection user input identifying a selected battery of the battery pack;
   wherein the maintenance circuitry is configured to associate the battery selection user input with a maintenance operation performed on the selected battery;
   wherein the maintenance circuitry is configured to present battery information relating to the selected battery on the display; and
   wherein the battery information includes information selected from the group consisting of test results from a test performed on the selected battery, a battery identification for the selected battery, a battery type of the selected battery, a number corresponding to the selected battery, a serial number of the selected battery, and a description of a condition of the selected battery.

2. The system of claim 1, wherein the maintenance circuitry is configured to display user-selectable areas overlaying the image on the display, each user-selectable area corresponding to one of the plurality of batteries, wherein the battery selection user input comprises a selection of the user-selectable area corresponding to the selected battery.

3. The system of claim 2, wherein the user-selectable areas are each surrounded by a graphical boundary overlaying the image.

4. The system of claim 2, wherein the user input circuitry comprises touchscreen interface for the display.

5. The system of claim 3, wherein maintenance circuitry is configured to move one of the boundaries based on a boundary user input received through the user input circuitry.

6. The system of claim 5, wherein the maintenance circuitry is configured to highlight the user-selectable area or the selected battery corresponding to the battery selection user input on the display.

7. The system of claim 1, wherein the maintenance circuitry is configured to edit the battery information for the selected battery based on battery information user input received through the user input circuitry.

8. The system of claim 1, wherein the maintenance circuitry is configured to provide test instructions on the display describing one or more steps for performing a battery test on the selected battery.

9. The system of claim 8, wherein the test instructions are selected from the group consisting of a list of the one or more steps, one or more images of the one or more steps, and a video demonstrating the one or more steps.

10. The system of claim 9, wherein the maintenance circuitry is configured to display test results of a battery test performed on the selected battery on the display.

11. The system of claim 10, wherein the test results include parameters of the selected battery measured by the maintenance circuitry selected from the group consisting of static parameters, dynamic parameters, load testing parameters, capacitance, state of charge, and voltage.

12. The system of claim 1, wherein the maintenance circuitry is configured to create a battery record for the selected battery including an image of the selected battery and battery information corresponding to the selected battery selected from the group consisting of test results from a test performed on the selected battery, a battery identification for the selected battery, a battery type of the selected battery, a number corresponding to the selected battery, a serial number of the selected battery, and a description of a condition of the selected battery.

13. The system of claim 12, including communications circuitry configured to communicate the battery record to a remote location.

14. The system of claim 1, including a camera for capturing the image of the battery pack.

15. The system of claim 1, wherein the image input circuitry is configured to receive the image over a wired or wireless connection.

16. A method performed by a battery pack maintenance system comprising:
receiving an image of a battery pack having a plurality of batteries using image input circuitry of the system;
displaying the image on a display of the system;
receiving a battery selection user input identifying a selected battery of the battery pack using user input circuitry of the system;
associating the battery selection user input with a maintenance operation performed on the selected battery using maintenance circuitry of the system;
presenting battery information on the display relating to the selected battery using the maintenance circuitry; and
wherein the battery information includes information selected from the group consisting of test results from a test performed on the selected battery, a battery identification for the selected battery, a battery type of the selected battery, a number corresponding to the selected battery, a serial number of the selected battery, and a description of a condition of the selected battery.

17. The method of claim 16, wherein:
the method includes displaying user-selectable areas overlaying the image on the display, each user-selectable area corresponding to one of the plurality of batteries; and
the battery selection user input comprises a selection of the user-selectable area corresponding to the selected battery using an input device of the system.

18. The method of claim 17, wherein the user-selectable areas are each surrounded by a graphical boundary overlaying the image.

19. The method of claim 17, wherein the user input circuitry comprises touchscreen interface for the display.

20. The method of claim 18, including:
receiving a boundary user through user input circuitry; and
adjusting the graphical boundary overlaying the image based the boundary user input.

21. The method of claim 20, including highlighting the user-selectable area or the selected battery corresponding to the battery selection user input on the display using the maintenance circuitry.

22. The method of claim 16, including:
receiving battery information user input through the user input circuitry;
editing the battery information for the selected battery based on the battery information user input using the maintenance circuitry.

23. The method of claim 16, including displaying test instructions on the display describing one or more steps for performing a battery test on the selected battery using the maintenance circuitry.

24. The method of claim 23, wherein the test instructions are selected from the group consisting of a list of the one or more steps, one or more images of the one or more steps, and a video demonstrating the one or more steps.

25. The method of claim 24, including displaying test results of a battery test performed on the selected battery on the display using the maintenance circuitry.

26. The method of claim 25, wherein the test results include parameters of the selected battery measured by the maintenance circuitry selected from the group consisting of static parameters, dynamic parameters, load testing parameters, capacitance, state of charge, and voltage.

27. The method of claim 16, including creating a battery record for the selected battery including an image of the selected battery and battery information corresponding to the selected battery selected from the group consisting of test results from a test performed on the selected battery, a battery identification for the selected battery, a battery type of the selected battery, a number corresponding to the selected battery, a serial number of the selected battery, and a description of a condition of the selected battery, using the maintenance circuitry.

28. The method of claim 27, including communicating the battery record to a remote location using communications circuitry of the system.

29. The method of claim 16, including capturing the image using a camera of the system.

30. The method of claim 16, wherein receiving the image comprises receiving the image over a wired or wireless connection.

31. A method performed by a battery pack maintenance system comprising:
receiving an image of a battery pack having a plurality of batteries using image input circuitry of the system;
displaying the image on a display of the system;
receiving a battery selection user input identifying a selected battery of the battery pack using user input circuitry of the system;
associating the battery selection user input with a maintenance operation performed on the selected battery using maintenance circuitry of the system;
displaying a test result of a battery test performed on the selected battery on the display using the maintenance circuitry;
wherein the test result includes a parameter of the selected battery measured by the maintenance circuitry selected from the group consisting of static parameters, dynamic parameters, load testing parameters, capacitance, state of charge, and voltage.

32. A method performed by a battery pack maintenance system comprising:

receiving an image of a battery pack having a plurality of batteries using image input circuitry of the system;

displaying the image on a display of the system;

receiving a battery selection user input identifying a selected battery of the battery pack using user input circuitry of the system; and associating the battery selection user input with a maintenance operation performed on the selected battery using maintenance circuitry of the system;

creating a battery record for the selected battery including an image of the selected battery and battery information corresponding to the selected battery selected from the group consisting of test results from a test performed on the selected battery, a battery identification for the selected battery, a battery type of the selected battery, a number corresponding to the selected battery, a serial number of the selected battery, and a description of a condition of the selected battery, using the maintenance circuitry.

33. A battery pack maintenance system comprising:

maintenance circuitry configured to perform a maintenance operation on a battery pack having a plurality of batteries;

image input circuitry configured to receive an image of the battery pack;

a display configured to display the image;

user input circuitry configured to receive a battery selection user input identifying a selected battery of the battery pack;

wherein the maintenance circuitry is configured to associate the battery selection user input with a maintenance operation performed on the selected battery;

wherein the maintenance circuitry is configured to display a test result of a battery test performed on the selected battery on the display; and wherein the test result includes a parameter of the selected battery measured by the maintenance circuitry selected from the group consisting of static parameters, dynamic parameters, load testing parameters, capacitance, state of charge, and voltage.

34. A battery pack maintenance system comprising:

maintenance circuitry configured to perform a maintenance operation on a battery pack having a plurality of batteries;

image input circuitry configured to receive an image of the battery pack;

a display configured to display the image;

user input circuitry configured to receive a battery selection user input identifying a selected battery of the battery pack;

wherein the maintenance circuitry is configured to associate the battery selection user input with a maintenance operation performed on the selected battery; and wherein the maintenance circuitry is configured to create a battery record for the selected battery including an image of the selected battery and battery information corresponding to the selected battery selected from the group consisting of test results from a test performed on the selected battery, a battery identification for the selected battery, a battery type of the selected battery, a number corresponding to the selected battery, a serial number of the selected battery, and a description of a condition of the selected battery.

* * * * *